US010199098B2

(12) United States Patent
Sekar et al.

(10) Patent No.: US 10,199,098 B2
(45) Date of Patent: Feb. 5, 2019

(54) 2T-1R ARCHITECTURE FOR RESISTIVE RAM

(71) Applicant: Hefei Reliance Memory Limited, Hefei (CN)

(72) Inventors: Deepak Chandra Sekar, San Jose, CA (US); Wayne Frederick Ellis, Jericho Center, VT (US); Brent Steven Haukness, Monte Sereno, CA (US); Gary Bela Bronner, Los Altos, CA (US); Thomas Vogelsang, Mountain View, CA (US)

(73) Assignee: Hefei Reliance Memory Limited, Hefei (CN)

( * ) Notice: Subject to any disclaimer, the term of this patent is extended or adjusted under 35 U.S.C. 154(b) by 0 days.

(21) Appl. No.: 16/043,688

(22) Filed: Jul. 24, 2018

(65) Prior Publication Data

US 2018/0330782 A1  Nov. 15, 2018

Related U.S. Application Data

(62) Division of application No. 15/039,784, filed as application No. PCT/US2014/068624 on Dec. 4, 2014, now Pat. No. 10,037,801.

(60) Provisional application No. 62/010,923, filed on Jun. 11, 2014, provisional application No. 62/010,937, filed on Jun. 11, 2014, provisional application No. 61/913,099, filed on Dec. 6, 2013.

(51) Int. Cl.
*G11C 13/00* (2006.01)
*G11C 8/10* (2006.01)
*G11C 7/08* (2006.01)

(52) U.S. Cl.
CPC ............ *G11C 13/0028* (2013.01); *G11C 7/08* (2013.01); *G11C 8/10* (2013.01); *G11C 13/003* (2013.01); *G11C 13/004* (2013.01); *G11C 13/0023* (2013.01); *G11C 13/0026* (2013.01); *G11C 13/0069* (2013.01); *G11C 2013/0071* (2013.01); *G11C 2013/0083* (2013.01); *G11C 2213/74* (2013.01); *G11C 2213/79* (2013.01); *G11C 2213/82* (2013.01)

(58) Field of Classification Search
CPC .......................... G11C 13/003; G11C 13/0026
See application file for complete search history.

(56) References Cited

U.S. PATENT DOCUMENTS

2004/0130939 A1* 7/2004 Morikawa ............... G11C 11/15
365/158
2011/0280059 A1* 11/2011 Xiao ................... G11C 13/0007
365/148
2015/0206583 A1* 7/2015 Chou ................. G11C 13/0069
365/148

* cited by examiner

*Primary Examiner* — Hoai V Ho
*Assistant Examiner* — Jay Radke
(74) *Attorney, Agent, or Firm* — Sheppard Mullin Richter & Hampton LLP

(57) ABSTRACT

A memory device includes a plurality of resistive memory cells and a plurality of word lines. Each resistive memory cell includes a resistive memory element, a first switching element electrically coupled in series with the resistive memory element, and a second switching element electrically coupled in series with the first switching element. The first switching element and the second switching element in each resistive memory cell is coupled to different ones of the word lines.

7 Claims, 47 Drawing Sheets

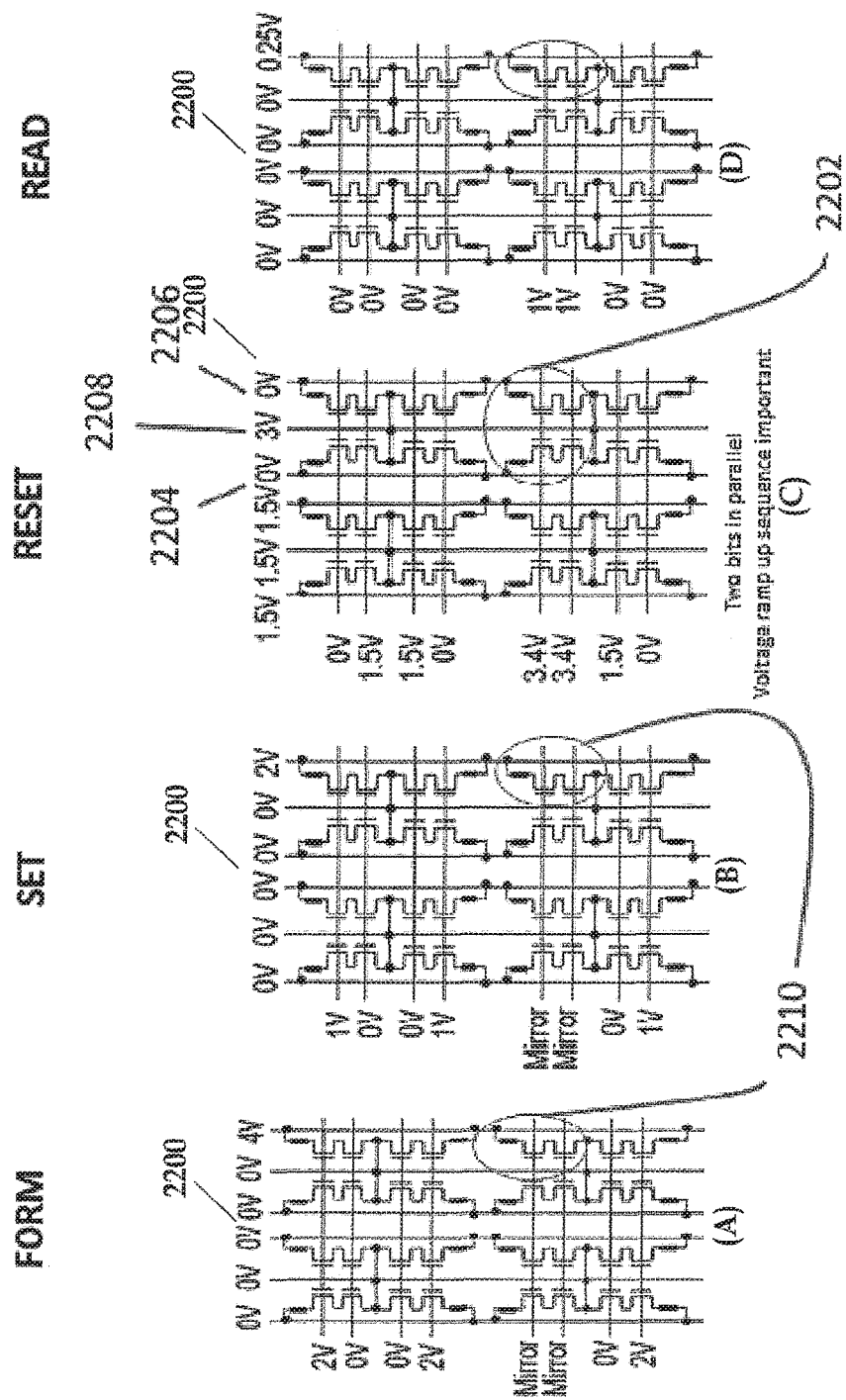

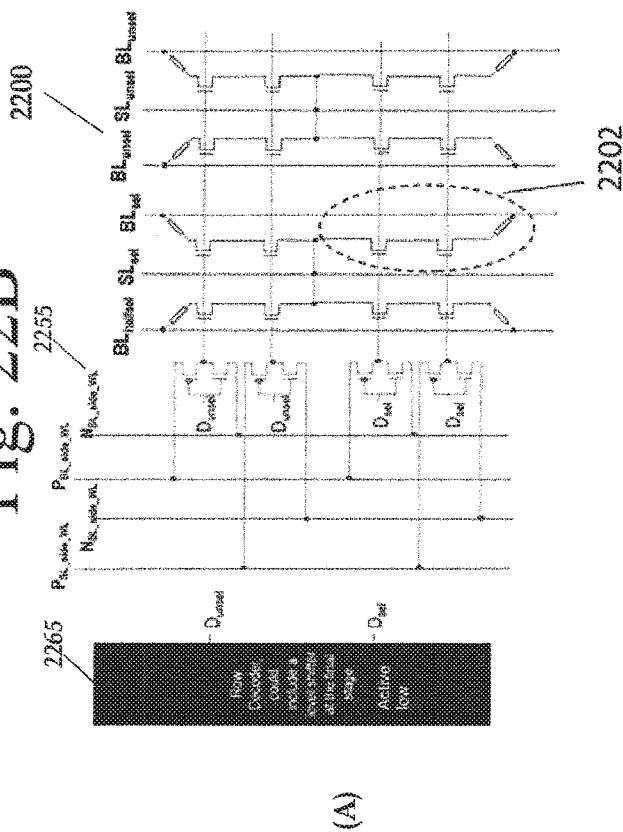

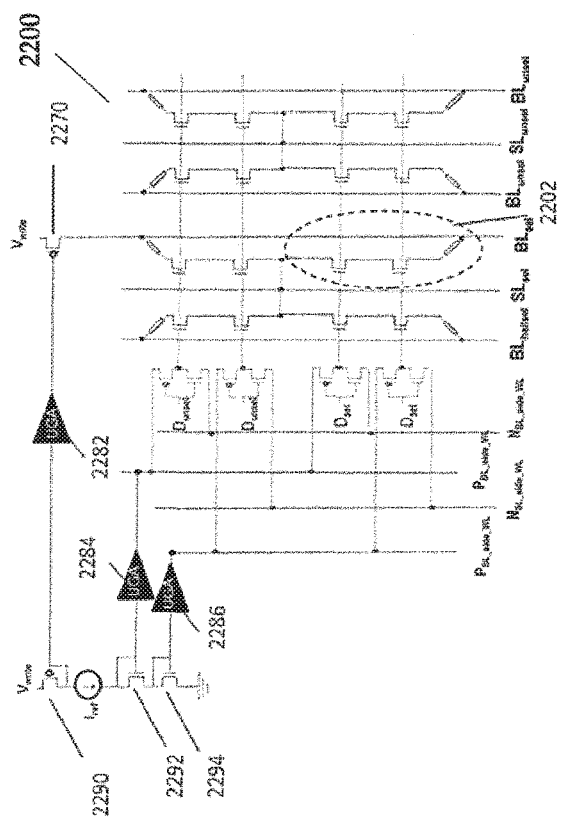

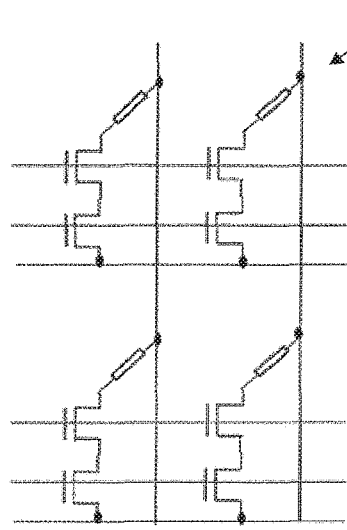 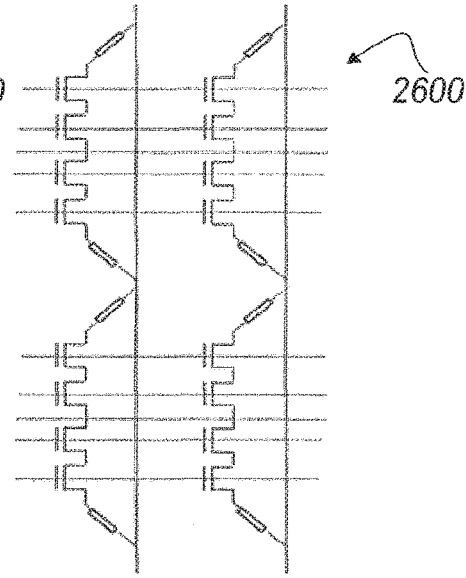
Fig. 25A　　　Fig. 26A
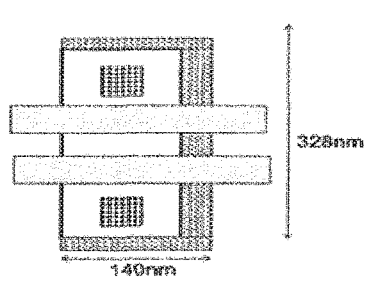 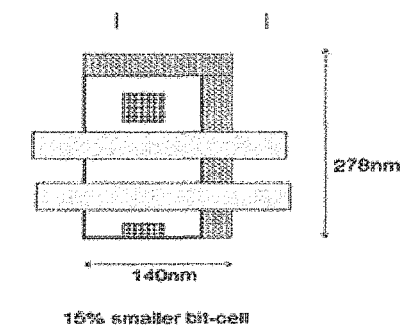
15% smaller bit-cell
Fig. 25B　　　Fig. 26B

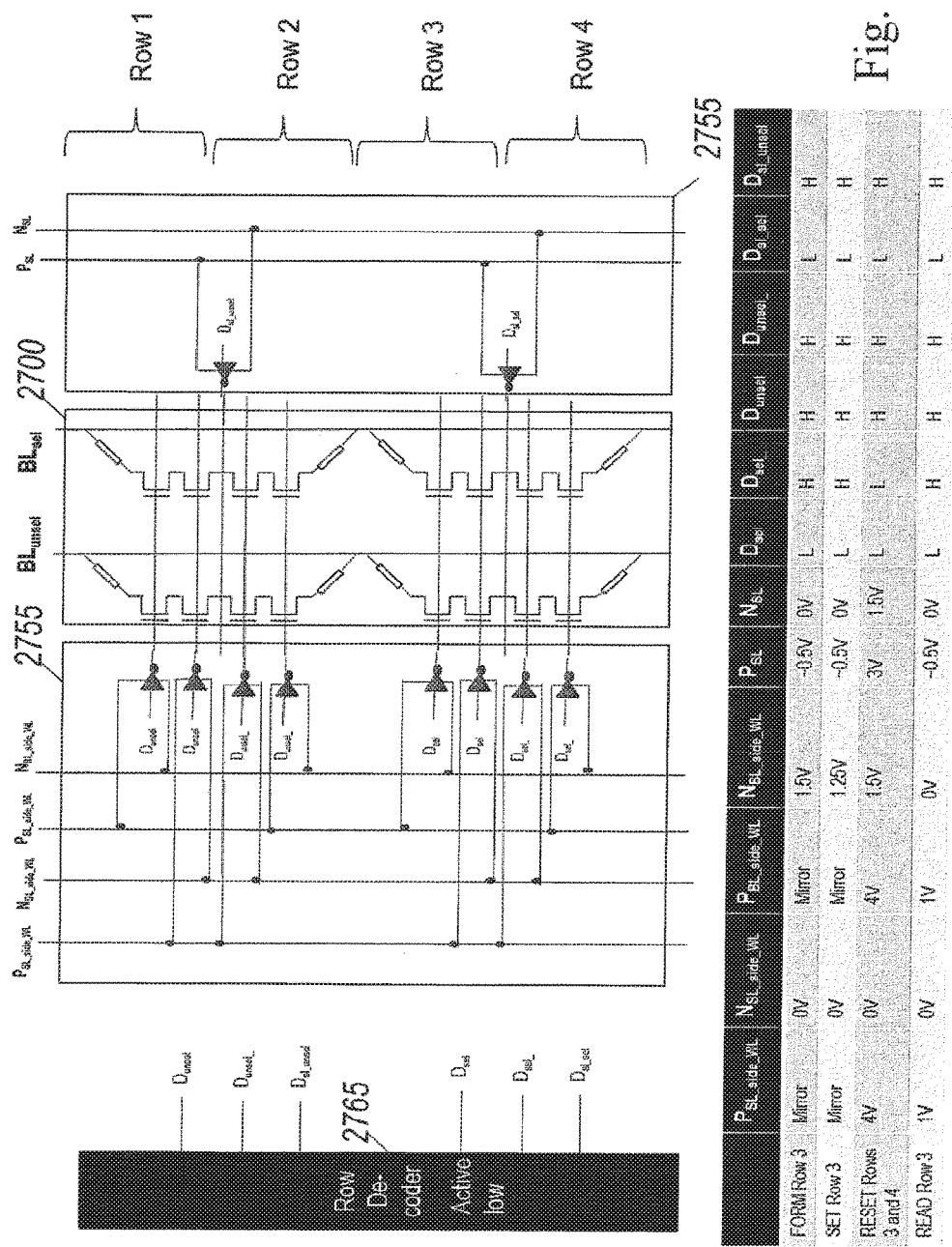

| $T_{top}, T_{bottom}$ | Junction leakage during RESET for 1Mb array (85°C) | Sub-threshold leakage during RESET for 1Mb array (85°C) | Max. write current possibly driven by cell |
|---|---|---|---|
| Super-low Vt | 0.5uA * 10⁶ = 0.5A | 0.2nA * 10⁶ = 0.2mA | 72uA |
| Low Vt | 0.1uA * 10⁶ = 0.1A | 0.2nA * 10⁶ = 0.2mA | 63uA |
| Regular Vt | 0.9nA * 10⁶ = 0.9mA | 30pA * 10⁶ = 30uA | 53uA |
| High Vt | 1.5nA * 10⁶ = 1.5mA | 63pA * 10⁶ = 63uA | 48uA |

| $T_{top}$ | $T_{bottom}$ | Junction leakage during RESET for 1Mb array (85°C) | Sub-threshold leakage during RESET for 1Mb array (85°C) | Total static leakage | Max. write current possibly driven by cell |
|---|---|---|---|---|---|
| Regular Vt | Regular Vt | 0.9nA * 10⁶ = 0.9mA | 30pA * 10⁶ = 30uA | 0.93mA | 53uA |
| Low Vt | Low Vt | 0.1uA * 10⁶ = 0.1A | 0.2nA * 10⁶ = 0.2mA | 0.1A | 63uA |
| Regular Vt | Superlow Vt | 0.95nA * 10⁶ = 0.9mA | 0.2nA * 10⁶ = 0.2mA | 1.12mA | 63uA |

Fig. 31

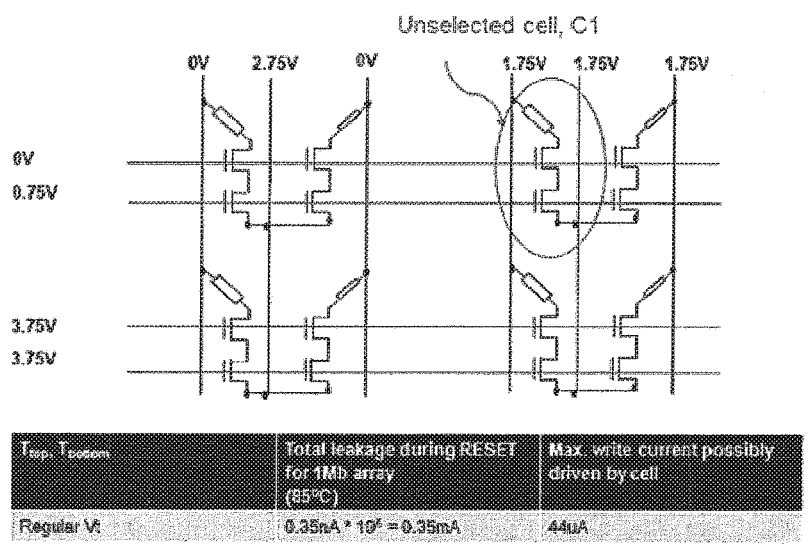

| $T_{top}$, $T_{bottom}$ | Total leakage during RESET for 1Mb array (85°C) | Max. write current possibly driven by cell |
|---|---|---|
| Regular Vt | 0.35nA * 10⁶ = 0.35mA | 44uA |

Fig. 32

2T-1R ARCHITECTURE FOR RESISTIVE RAM

CROSS-REFERENCE TO RELATED APPLICATIONS

The present application is a divisional application of U.S. patent application Ser. No. 15/039,784, filed May 26, 2016 and entitled "2T-1R Architecture for Resistive RAM," now U.S. patent Ser. No. 10/037,801, which is a national stage application pursuant to 35 U.S.C. § 371 of International Application No. PCT/US2014/068624, filed Dec. 4, 2014 and entitled "2T-1R Architecture for Resistive RAM," which claims priority to U.S. Provisional Patent Application Ser. No. 62/010,923 filed Jun. 11, 2014, U.S. Provisional Patent Application Ser. No. 62/010,937 filed Jun. 11, 2014, and U.S. Provisional Patent Application Ser. No. 62/913,099 filed Dec. 6, 2013, all of which are hereby incorporated by reference herein.

TECHNICAL FIELD

The present disclosure relates to semiconductor memory and, more particularly, to resistive random access memory (RRAM) with a two transistor, one resistive element (2T-1R) memory cell architecture.

BACKGROUND

Non-volatile memory devices that retain stored data in the absence of power are pervasively used in many consumer electronic products including cell phones, tablets, personal computers, personal digital assistants, and the like. Unfortunately, many non-volatile memory devices have limitations that make them unsuitable for use as primary storage for these products including higher cost and lower performance when compared to volatile memory devices such as dynamic random access memory (DRAM). Examples of older technology non-volatile memory devices include read-only memory (ROM) and flash memory. Examples of newer technology non-volatile memory devices include resistive random access memory (RRAM), phase change memory (PCM), spin-transfer torque magneto resistive random access memory (STT-MRAM), ferroelectric random access memory (FRAM), and many others. RRAM operates on the basis that a typically insulating dielectric may be made to conduct through formation of a conduction path or filament upon application of a sufficiently high voltage. Formation of the conduction path may occur through different mechanisms, including defects and metal migration. Once the conduction path or filament forms, the filament may be reset (broken, resulting in high resistance) or set (reformed, resulting in lower resistance) by an appropriately applied voltage. Recent data suggests that the conduction path may include many current paths, rather than a single path through a single filament.

RRAM memory devices including conductive bridge RAM (CBRAM) and transition metal oxide RRAM are a focal point for current development. In CBRAM devices, metal filaments between two electrodes form the conduction path, where one of the electrodes participates in the reaction. In transition metal oxide RRAM, oxygen vacancy filaments in a transition metal such as hafnium oxide or tantalum oxide form the conduction path.

RRAM memory devices are often in use to store data or executable code in embedded applications having logic circuitry including core transistors. The voltage required to write data in RRAM memory devices may be higher than that required to operate the core transistors. A challenge to the use of RRAM memory devices in embedded applications, therefore, is to find a select transistor configured to select a cell in the RRAM memory device whose operational parameters are consistent with that of core transistors.

Input/output (I/O) transistors common in logic circuitry may be used as select transistors since I/O transistors may handle the high voltage requirements of RRAM memory devices. I/O transistors are disadvantageous as select transistors, however, because they have a large footprint that increases the cost of manufacture. A need remains, therefore, for an improved RRAM memory device including area efficient select transistors capable of handling higher voltages for use in embedded applications.

BRIEF DRAWINGS DESCRIPTION

The present disclosure describes various embodiments that may be understood and fully appreciated in conjunction with the following drawings:

FIG. 22A is a diagram of an embodiment of a 2T-1R memory array having shared vertical source lines;

FIG. 22B is a diagram of an embodiment of a 2T-1R memory array with row drivers and exemplary biases for various operations;

FIG. 22C is a diagram of an embodiment of a 2T-1R memory array with row drivers and exemplary biases for various operations;

FIG. 25A is a diagram of an embodiment of a portion of 2T-1R memory array;

FIG. 25B is a diagram of layout of an embodiment of a 2T-1R memory cell included in the 2T-1R memory array shown in FIG. 25A;

FIG. 26A is a diagram of an embodiment of a 2T-1R memory array with shared source lines;

FIG. 26B is a diagram of an embodiment of a layout of a 2T-1R memory cell included in the 2T-1R memory array shown in FIG. 26A;

FIG. 27A is a diagram of an embodiment of row driver circuit 2755;

FIG. 31 is a table listing various measured currents for an unselected cell having a mix of doping levels for select transistors $T_{top}$ and $T_{bottom}$;

FIG. 32 is a diagram of an embodiment of a 2T-1R memory array having shared vertical source lines;

DETAILED DESCRIPTION

Figure 1:
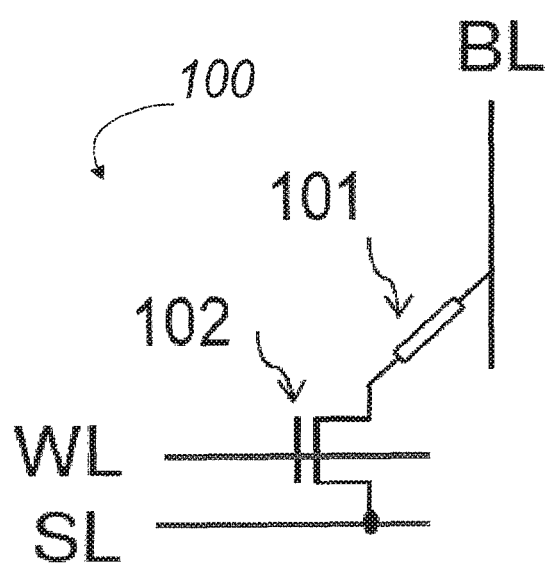
FIG. 1 is a diagram of an embodiment of a 1T-1R memory cell.

The present disclosure describes embodiments with reference to the drawing figures listed above. Persons of ordinary skill in the art will appreciate that the description and figures illustrate rather than limit the disclosure and that, in general, the figures are not drawn to scale for clarity of presentation. Such skilled persons will also realize that many more embodiments are possible by applying the inventive principles contained herein and that such embodiments fall within the scope of the disclosure which is not to be limited except by the claims.

Referring to FIG. 1, a 1T-1R memory cell 100 includes a memory element 101 coupled to a select transistor 102 at a first end and coupled to a bit line terminal at a second end that receives a bit line signal BL. Select transistor 102 receives a word line signal WL on a gate terminal and a source line signal SL on a source terminal. Memory cell 100, therefore, operates in response to bit line signal BL, word line signal WL, and source line signal SL.

Memory element 101 may include any kind of memory technology known to a person of ordinary skill in the art that changes resistance as a function of applied voltage or current, e.g., Resistive Random Access Memory (RRAM), Phase Change Memory (PCM), Spin-Transfer Torque Magnetic Random Access Memory (STT-MRAM), and the like.

Figure 2:
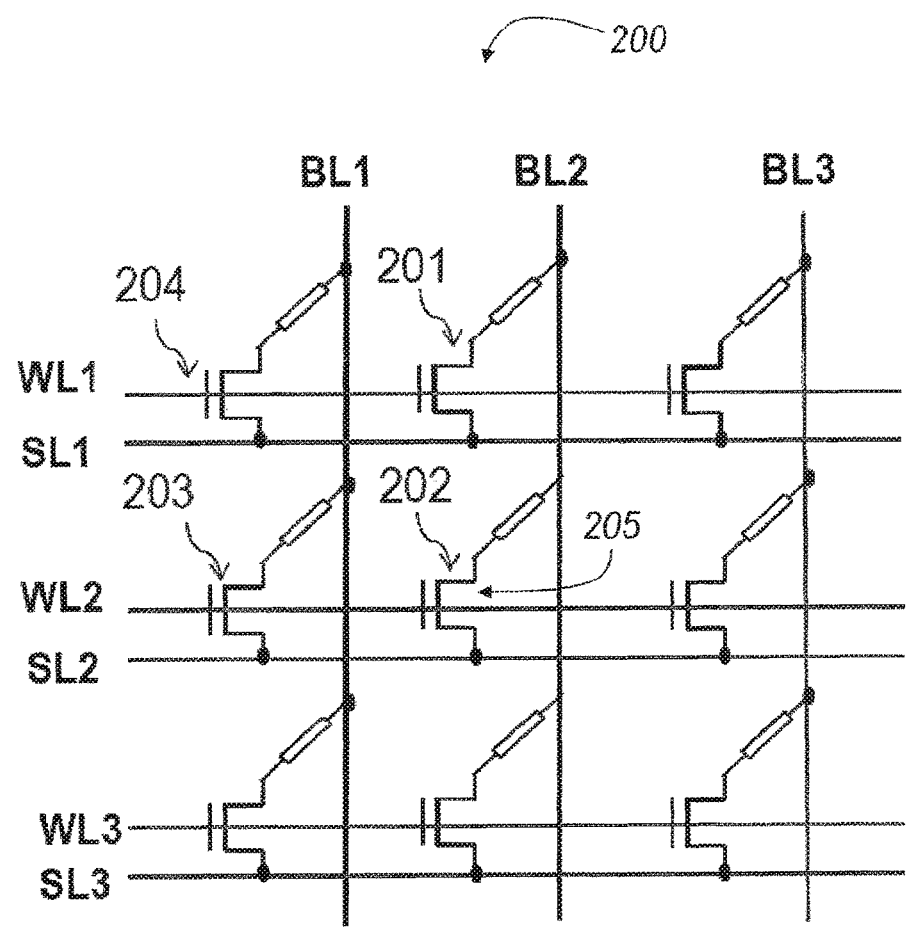
FIG. 2 is a diagram of an embodiment of a portion of a 1T-1R memory array.

FIG. 2 is a diagram of a portion of a 1T-1R memory array 200 including a plurality of memory cells, e.g., cells 201, 202, 203, and 204, arranged in a plurality of columns extending in a first direction and a plurality of rows extending in a second direction perpendicular to the first direction. Memory cells 201, 202, 203, and 204 may have a construction similar to that of memory cell 100 shown in FIG. 1. As with memory cell 100, each of memory cells 201, 202, 203, and 204 is coupled to receive a bit line signal BL, word line signal WL, and source line signal SL. Memory cells 201, 202, 203, and 204 may include any type of memory technology known to a person of ordinary skill in the art that changes resistance as a function of applied voltage or current, e.g., RRAM, PCM, STT-MRAM, and the like.

In an embodiment of array 200, a column of memory cells is coupled to receive a common bit line signal while a row of memory cells is coupled to receive a common word line signal and a common source line signal. For example, memory cells 204 and 203 arranged on a first column commonly receive a first bit line signal BL1 while memory cells 201 and 202 arranged on a second column commonly receive a second bit line signal BL2. Memory cells 204 and 201 arranged on a first row commonly receive a first word line signal WL1 at corresponding gate terminals and receive a first source line signal SL1 at corresponding source terminals. Likewise, memory cells 203 and 202 arranged on a second row commonly receive a second word line signal WL2 at corresponding gate terminals and receive a second source line signal SL2 at corresponding source terminals.

In an embodiment in which memory cell 202 is selected for a form operation before switching memory cell 202 between set and reset operations, an exemplary bias scheme is as follows:
  Bit line signal BL2=3.5V
  Source line signal SL2=0V
  Word line signal WL2=1.5V
  All other bias signals BL1, BL3, SL1, SL3, WL1, WL3,=0V In such a configuration, a gate of select transistor 205 in memory cell 202 may have a voltage across it of 3.5V, which is higher than the supply voltage of 1.1V or less applied during typical operations. The higher voltage drop may cause gate dielectric breakdown in select transistor 205, which, in turn, may lead to device failure. To avoid gate dielectric breakdown, an I/O transistor may function as select transistor 205 since most I/O transistors are rated to operate at higher voltages, e.g., 1.5V or 1.8V in 28 nm technologies, because of thicker gate dielectrics.

Figure 3:
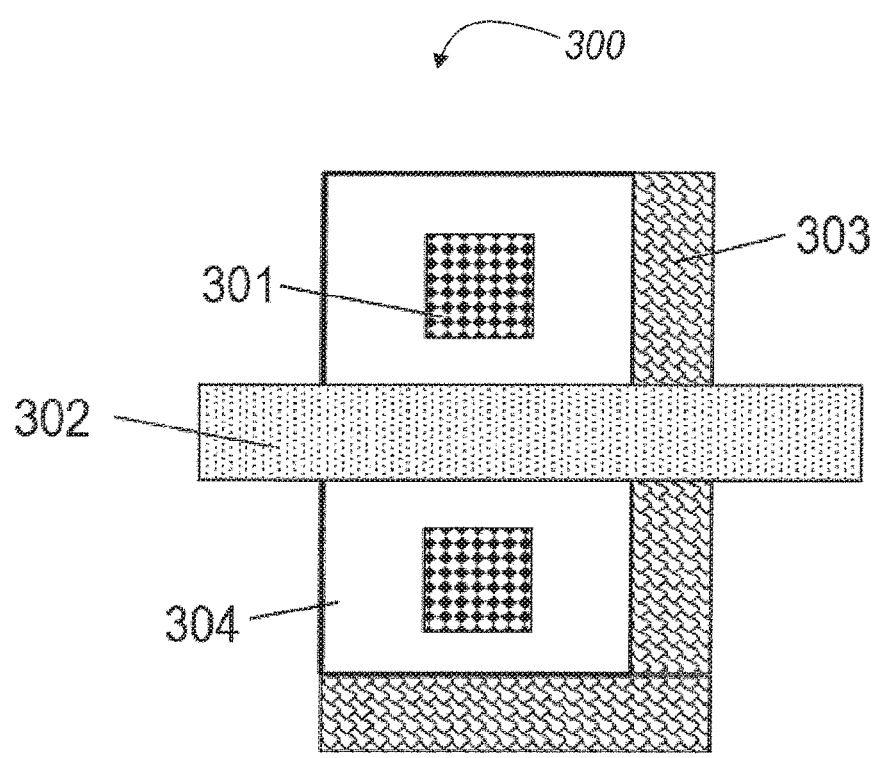
FIG. 3 is a diagram of an embodiment of a layout for a select transistor.

FIG. 3 is a diagram of an I/O select transistor 300 which includes contacts 301, a gate 302, an oxide isolation area 303, and a diffusion area 304. By using I/O select transistor 300, a length of gate 302, a distance between contacts 301 and gate 302, and a width of select transistor 300 may all be larger than necessary for optimally operating memory cell 101. Since an area of I/O select transistor 300 may determine the minimum area of memory cell 101, using I/O select transistor 300 in array 200 shown in FIG. 2 may increase the overall size of the logic chip with embedded non-volatile memory present. Thus, an alternative to using I/O select transistor 300 may be beneficial especially if the alternative results in decreasing die size without adding lithography steps.

Figure 4A:
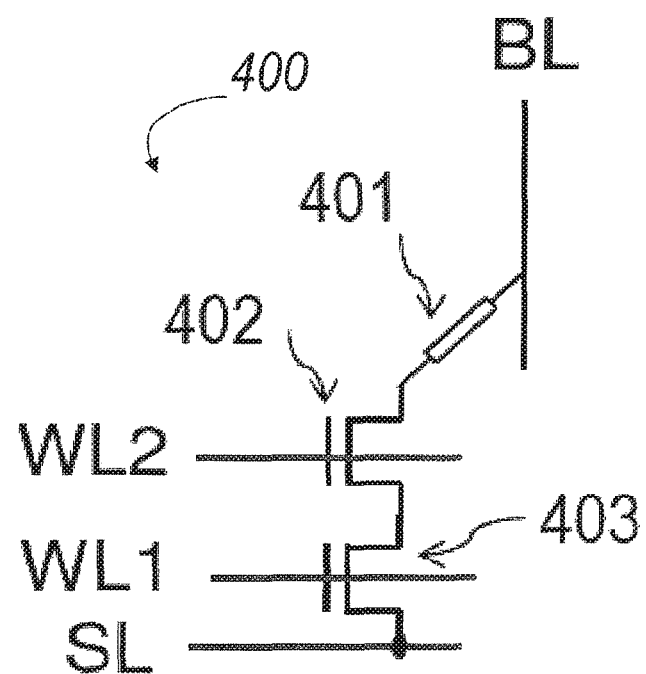
FIG. 4A is a diagram of an embodiment of a 2T-1R memory cell.

Referring to FIG. 4A, a 2T-1R memory cell 400 includes a memory element 401 serially-coupled to select transistor 402 and to select transistor 403 at a first end. Memory element 401 is coupled to a bit line terminal at a second end that receives a bit line signal BL. Select transistor 402 receives a word line signal WL1 on a corresponding gate terminal, Select transistor 403 receives a word line signal WL2 on a corresponding gate terminal and a source line signal SL on a corresponding source terminal. Memory cell 400, therefore, operates in response to bit line signal BL, word line signals WL1 and WL2, and source line signal SL. The two select transistors 402 and 403 allow minimizing the gate oxide breakdown, punch-through and other deleterious effects by reducing the voltage across the gate of select transistors 402 and 403. For example, memory element 401 may require 3.5V and up to 1 us of current during a form operation. By biasing select transistors 402 and 403 as shown in e.g., FIG. 5B, a maximum voltage across the gate of any of unselected memory cells is about 2V compared to the 3.5V drop across the gate dielectric observed in memory cell 100. Because memory cell 400 includes two select transistors 402 and 403, each being independently controlled and biased with corresponding word line signals WL1 and WL2, select transistors 402 and 403 may be manufactured using any type of transistor technology, including lower voltage rated core logic transistors instead of using much larger, higher voltage rated I/O transistors. The lower voltage rated core logic transistors may reduce cell size.

A person of ordinary skill in the art will recognize that use of core transistors may provide advantages including smaller die size and improved optimization over I/O transistors particularly in embedded non-volatile memory applications since core transistors are the focus of process optimization by logic technology manufacturers.

Like memory element 101, memory element 401 may include any kind of memory technology known to a person of ordinary skill in the art that changes resistance as a function of applied voltage or current, e.g., RRAM, PCM, STT-MRAM, and the like.

Figure 4B:
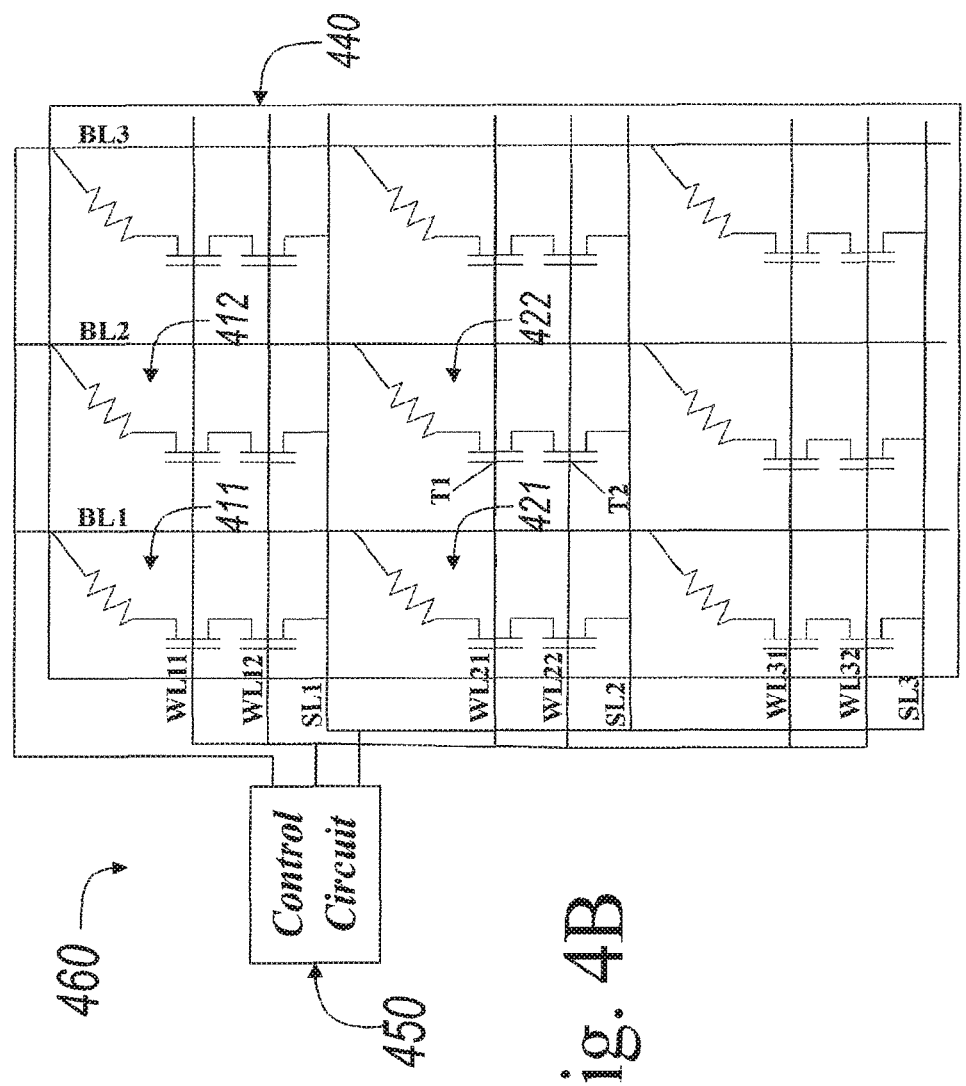
FIG. 4B is a diagram of an embodiment of a 2T-1R memory system including the 2T-1R memory cell shown in FIG. 4A.

Referring to FIG. 4B, a 2T-1R memory device 460 includes a control circuit 450 coupled to a 2T-1R memory array 440 (only a portion of array 400 is shown). In an exemplary embodiment, 2T-1R memory array 440 includes a plurality of memory cells, e.g., cells 411, 412, 421, and 422, arranged in a plurality of columns extending in a first direction and a plurality of rows extending in a second direction perpendicular to the first direction and having a construction like that of memory cell 400 shown in FIG. 4. As the 2T-1R name implies, each of memory cells 411, 412, 421, and 422 in array 440 includes two select transistors and a memory element. Each memory cell in array 440 including memory cells 411, 412, 421, and 422 is coupled to receive a bit line signal BL, two word line signals WL1 and WL2, and a source line signal SL. For example, memory cell 411 is coupled to receive bit line signal BL1, word line signals WL11 and WL12, and source line signal SL1.

A control circuit 450 is coupled to 2T-1R memory array 400 and configured to generate voltage signals, e.g., word line signals, bit line signals, and source line signals, necessary for the various operations performed on memory array 400. In an embodiment, control circuit 450 avoids voltage or high current stresses on the select transistors T1 and T2 that would result in damage, wear out, reduced life, or the like, by applying the necessary voltage signals in predetermined levels and/or in a predetermined sequence as further described below.

Figures 5A, 5B:
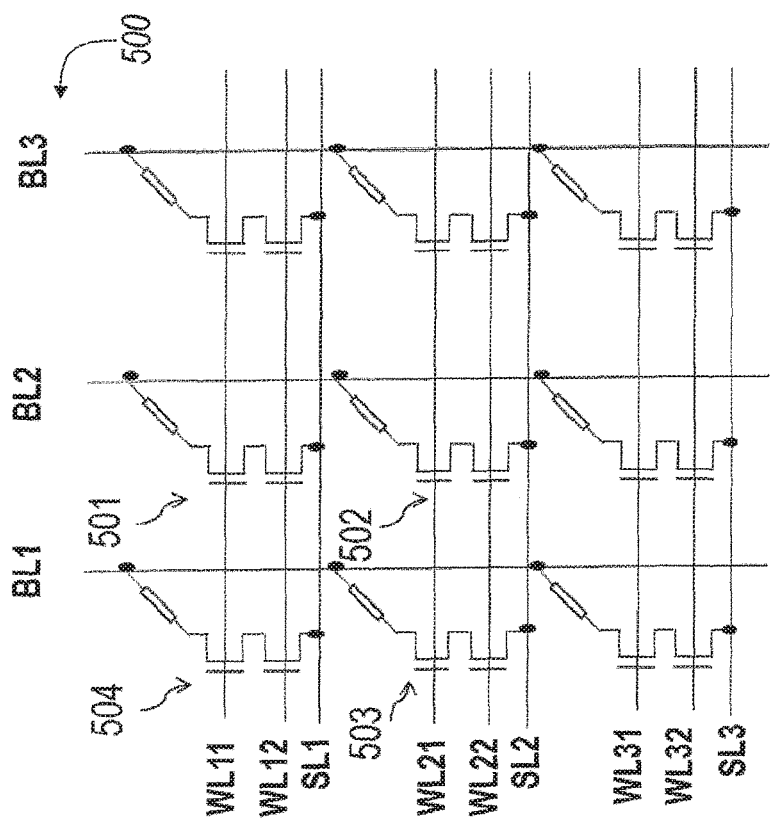
FIG. 5A is a diagram of an embodiment of a 2T-1R memory array.
FIG. 5B is a table with exemplary biases for a form operation for the 2T-1R memory array shown in FIG. 5A.

FIG. 5A is a diagram of a portion of a 2T-1R memory array 500 including a plurality of memory cells, e.g., memory cells 501, 502, 503, and 504. In an embodiment, each of memory cells 501, 502, 503, and 504 have a construction like that of 2T-1R memory cell 400 shown in FIG. 4 and may be arranged in a plurality of columns extending in a first direction and a plurality of rows extending in a second direction perpendicular to the first direction. As the 2T-1R name implies, each of memory cells 501, 502, 503, and 504 in array 500 includes two select transistors and a memory element. Each memory cell in array 500 including memory cells 501, 502, 503, and 504 is coupled to receive a bit line signal BL, two word line signals WL1 and WL2, and a source line signal SL from a control circuit, e.g., control circuit 450 shown in FIG. 4B.

In an embodiment, memory cells arranged on a row of the array 500 are configured to receive the same two word line signals and the same source line signal. For example, memory cells 504 and 501 receive word line signals WL11 and WL12 at corresponding gate terminals, respectively, and source line signal SL1 at corresponding source line terminals. Likewise, memory cells 503 and 502 receive word line signals WL21 and WL22 at corresponding gate terminals, respectively, and source line signal SL2 at corresponding source terminals.

Memory cells arranged on a column of memory array 500 are configured to receive the same bit line signal. For example, memory cells 504 and 503 receive bit line signal BL1 and memory cells 501 and 502 receive bit line signal BL2. A person of ordinary skill in the art should recognize that other arrangements of array 500 are possible and come within the scope of the inventive principles disclosed herein.

Memory cells 501, 502, 503, and 504 may include any type of memory technology known to a person of ordinary skill in the art that changes resistance as a function of applied voltage or current, e.g., RRAM, PCM, STT-MRAM, and the like.

As is well known, memory cells 501, 502, 503, and 504 may be subject to three types of operations: form, reset, and set. A form operation may create or form a conduction path through one or more filaments formed in the memory cell after application of a sufficiently high voltage. A form operation may occur just after manufacture of the memory cell but before actual data storage. The conduction path or filament is reset (broken) or set (re-created) after a form operation.

FIG. 5B is an exemplary bias scheme for a form operation performed on memory cell 502 of array 500. A person of ordinary skill in the art should recognize that other bias schemes for a form operation are possible. In the exemplary bias scheme shown in FIG. 5B, a maximum voltage across the gate of any of unselected memory cells 501, 503, or 504 is about 2V compared to the 3.5V drop across the gate dielectric observed in memory cell 100. The lower voltage drop across the gate of select transistors for unselected memory cells 501, 503, and 504 allows for the use of smaller transistors, e.g., core logic transistors, which, in turn, reduces cell size.

Figures 6A, 6B:
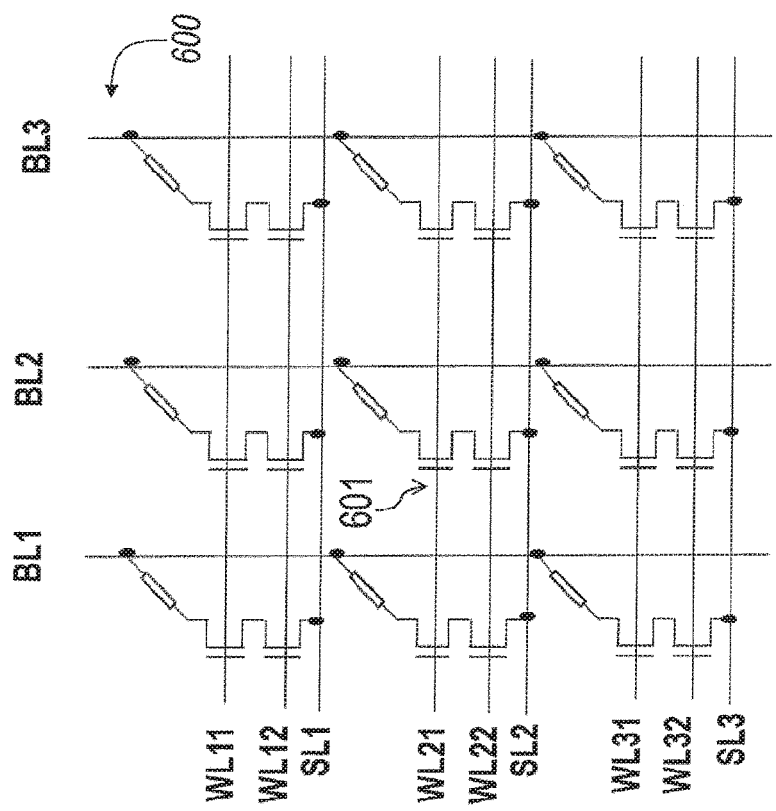
FIG. 6A is a diagram of an embodiment of a 2T-1R memory array.
FIG. 6B is a table with exemplary biases for a reset operation for the 2T-1R memory array shown in FIG. 6A.

FIG. 6A is a diagram of a portion of a 2T-1R memory array 600 including a plurality of memory cells, e.g., memory cell 601. In an embodiment, the plurality of memory cells including memory cell 601 have a construction like that of 2T-1R memory cell 400 shown in FIG. 4 and may be arranged in a plurality of columns extending in a first direction and a plurality of rows extending in a second direction perpendicular to the first direction.

FIG. 6B is an exemplary bias scheme for a reset operation performed on memory cell 601 of array 600. A person of ordinary skill in the art should recognize that other bias schemes for a reset operation are possible. In the exemplary bias scheme shown in FIG. 6B, a maximum voltage across the gate of any of unselected memory cells is less than 2V, compared to the 3.5V drop across the gate dielectric observed in memory cell 100.

Figures 7A, 7B:
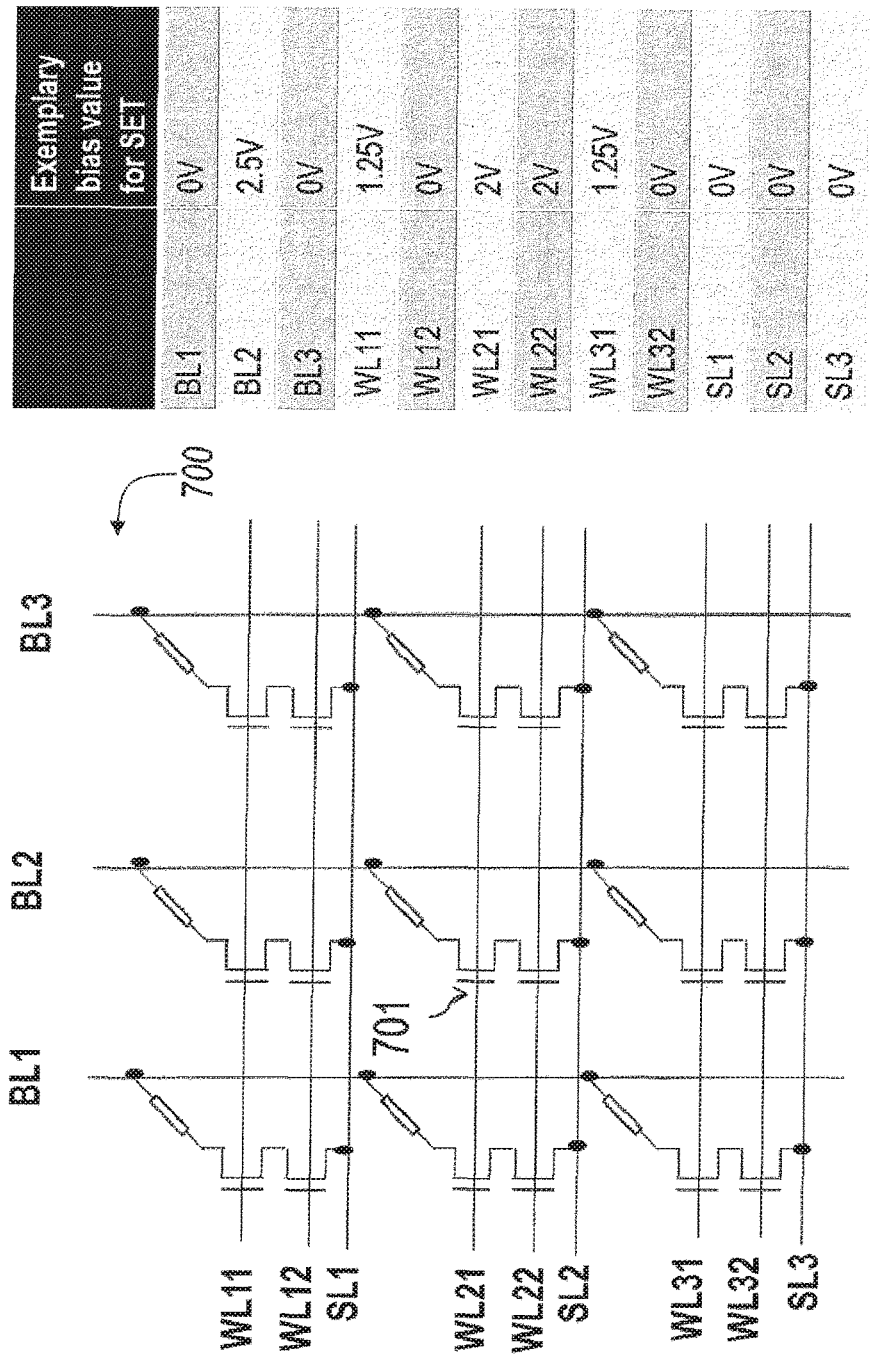
FIG. 7A is a diagram of an embodiment of a 2T-1R memory array.
FIG. 7B is a table with exemplary biases for a set operation for the 2T-1R memory array shown in FIG. 7A.

FIG. 7A is a diagram of a portion of a 2T-1R memory array 700 including a plurality of memory cells, e.g., memory cell 701. In an embodiment, the plurality of memory cells including memory cell 701 have a construction like that of 2T-1R memory cell 400 shown in FIG. 4 and may be arranged in a plurality of columns extending in a first direction and a plurality of rows extending in a second direction perpendicular to the first direction.

FIG. 7B is an exemplary bias scheme for a set operation performed on memory cell 701 of array 700. A person of ordinary skill in the art should recognize that other bias schemes for a set operation are possible. In the exemplary bias scheme shown in FIG. 7B, a maximum voltage across the gate of any of unselected memory cells is less than 2V, compared to the 3.5V drop across the gate dielectric observed in memory cell 100.

Figures 8A, 8B:
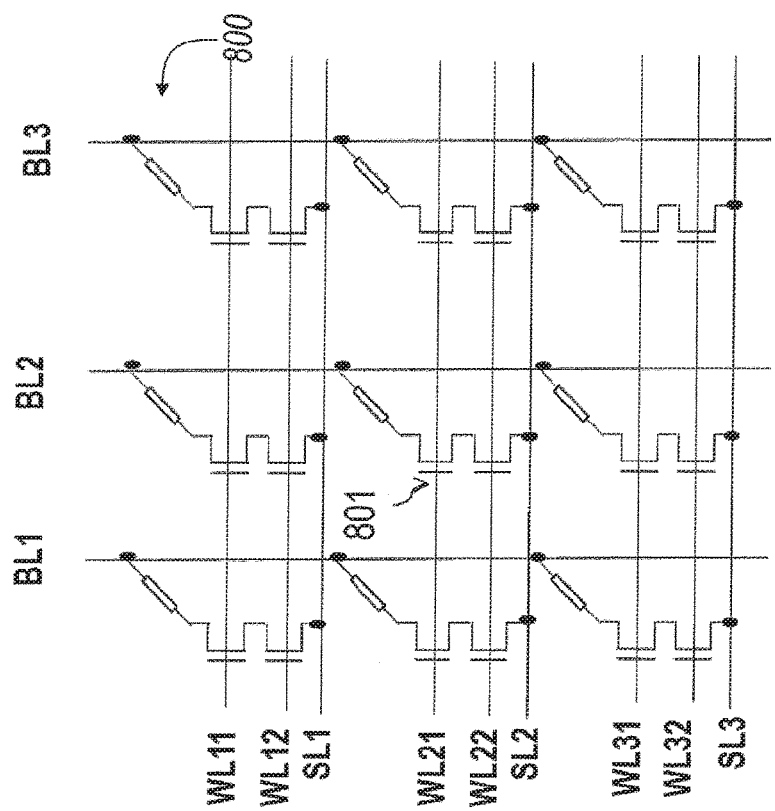
FIG. 8A is a diagram of an embodiment of a 2T-1R memory array.
FIG. 8B is a table with exemplary biases for a read operation for the 2T-1R memory array shown in FIG. 8A.

FIG. 8A is a diagram of a portion of a 2T-1R memory array 800 including a plurality of memory cells, e.g., memory cell 801. In an embodiment, the plurality of memory cells including memory cell 801 have a construction like that of 2T-1R memory cell 400 shown in FIG. 4 and may be arranged in a plurality of columns extending in a first direction and a plurality of rows extending in a second direction perpendicular to the first direction. FIG. 8B is an exemplary bias scheme for a read operation performed on memory cell 801.

Figure 9:
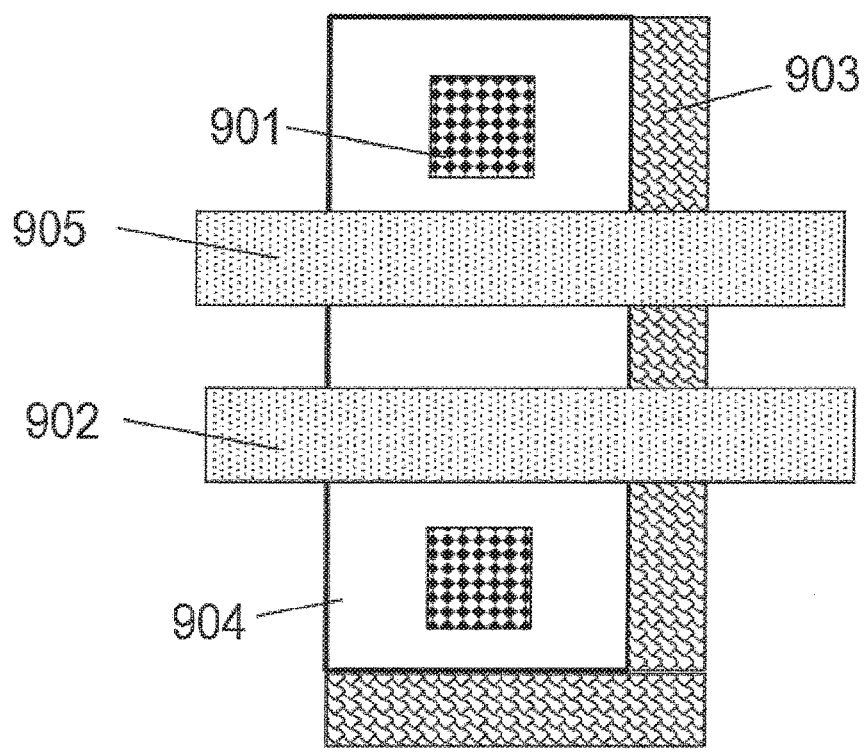
FIG. 9 is a diagram of an embodiment of a layout of an embodiment of the select transistors shown in FIG. 4.

FIG. 9 is a diagram of select transistors 402 and 403 of memory cell 400 shown in FIG. 4. Transistors 402 and 403 include contact area 901, gate areas 902 and 905, oxide isolation area 903, and diffusion area 904. Various dimensions in FIG. 9 may potentially be smaller than corresponding dimensions in the prior art I/O select transistor approach shown in FIG. 3, which, in turn, may lead to the possibility of lower cell size and other advantages. A person of ordinary skill in the art should recognize that various alternatives to laying out select transistors 402 and 403 are possible, including the addition of vertical source lines instead of horizontal source lines as shown in e.g., FIGS. 5A, 6A, 7A, and 8A. A person of ordinary skill in the art should likewise recognize that bit lines, source lines, or other lines may be shared or common to two or more adjacent memory cells. A person of ordinary skill in the art should recognize that hierarchical wiring schemes may be used to reduce area and that one of select transistors 402 or 403 may be shared between more than a single memory cell.

Figure 10:
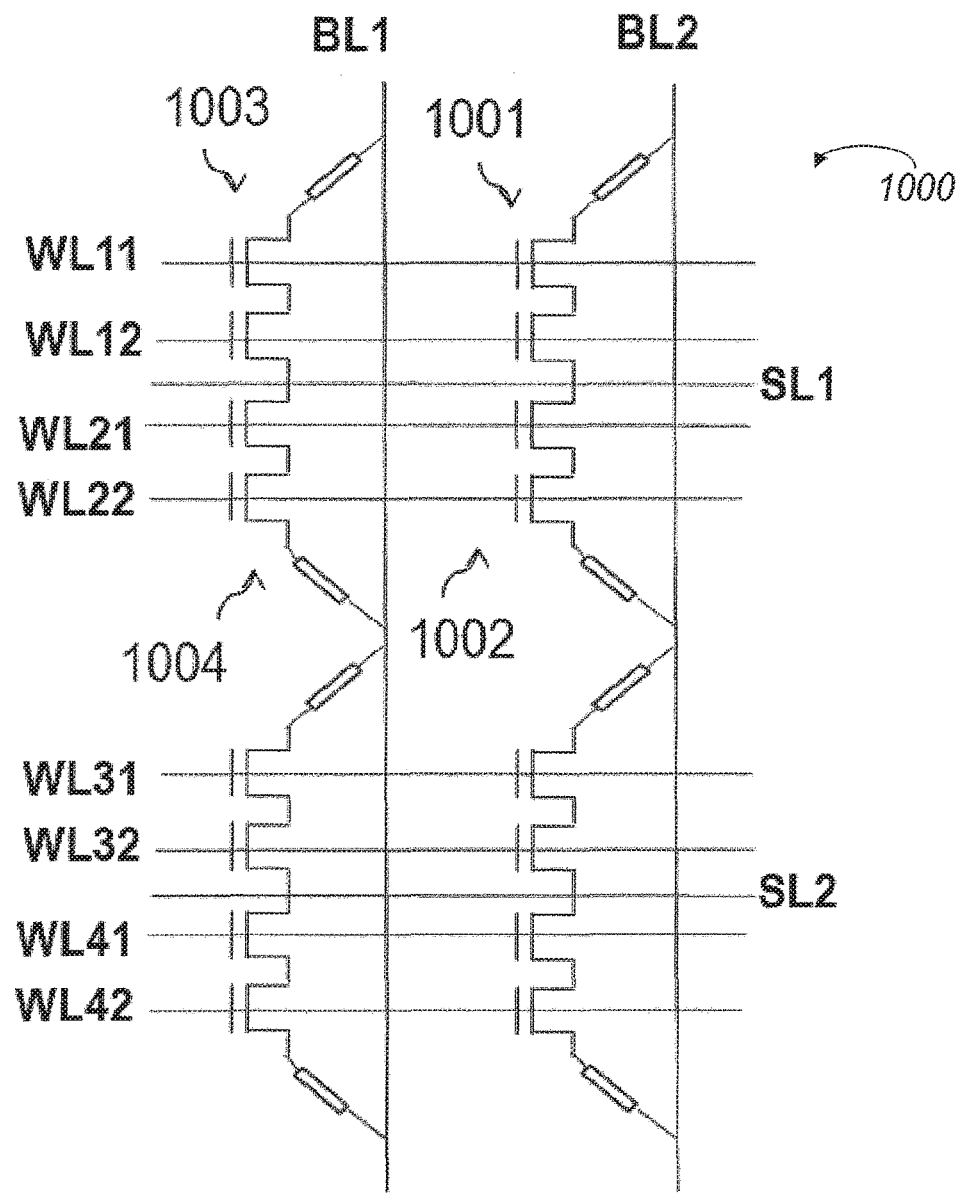
FIG. 10 is a diagram of an embodiment of a 2T-1R memory array.

FIG. 10 is a diagram of a portion of a 2T-1R memory array 1000 including a plurality of memory cells, e.g., memory cells 1001, 1002, 1003, and 1004. In an embodiment, each of the plurality of memory cells including memory cells 1001, 1002, 1003, and 1004 have a construction like that of 2T-1R memory cell 400 shown in FIG. 4A and may be arranged in a plurality of columns extending in a first direction and a plurality of rows extending in a second direction perpendicular to the first direction. In an embodiment, each of memory cells 1001, 1002, 1003, and 1004 is coupled to receive a bit line signal BL, two pairs of word line signals WL1(1,2) and WL2(1,2), and a source line signal SL.

Memory cells arranged on rows of array 1000 are configured to receive the same two word line signals and memory cells arranged on adjacent rows of array 1000 share a same source line signal. For example, memory cells 1003 and 1001 receive word line signals WL11 and WL12 and memory cells 1004 and 1002 receive word line signals WL21 and WL22. Memory cells 1003 and 1001 arranged on a row adjacent to memory cells 1004 and 1002 share source line signal SL1.

Memory cells arranged on a column of memory array 1000 are configured to receive the same bit line signal. For example, memory cells 1003 and 1004 arranged on a first column receive bit line signal BL1 and memory cells 1001 and 1002 arranged on a second column receive bit line signal BL2. A person of ordinary skill in the art should recognize that other arrangements of array 1000 are possible and come within the inventive principles disclosed herein. For example, in some embodiments, memory cells formed in adjacent rows or adjacent columns may share source lines, bit lines, source contacts, drain contacts, and the like depending on the architecture implemented.

Memory cells 1001, 1002, 1003, and 1004 may include any type of memory technology known to a person of ordinary skill in the art that changes resistance as a function of applied voltage or current, e.g., RRAM, PCM, STT-MRAM, and the like.

Like previously-described memory cells, memory cells 1001, 1002, 1003, and 1004 may be subject to three types of operations: form, reset, and set. A form operation may create or form a conduction path through one or more filaments formed in the memory cell after application of a sufficiently high voltage. A form operation may occur just after manufacture of the memory cell but before actual data storage. The conduction path or filament is reset (broken) or set (re-formed) after a form operation.

FIGS. 11A, 12A, 13A, and 14A are diagrams of portion of 2T-1R memory array 1000 (shown in FIG. 10) including a plurality of memory cells each having a construction similar to that of memory cell 400 shown in FIG. 4A. Memory array 1000 may include a plurality of memory cells that are arranged in a plurality of columns extending in a first direction and a plurality of rows extending in a second direction perpendicular to the first direction. Memory cells arranged on adjacent rows may share a common source line signal.

Figures 11A, 11B:
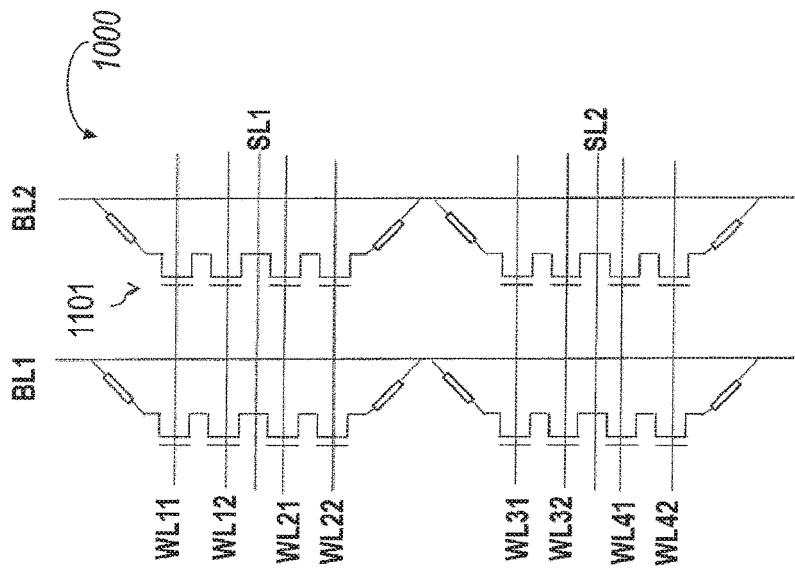
FIG. 11A is a diagram of an embodiment of a 2T-1R memory array.
FIG. 11B is a table with exemplary biases for a form operation for the 2T-1R memory array shown in FIG. 11A.

FIG. 11B is an exemplary bias scheme for a form operation performed on memory cell 1101 shown in FIG. 11A. A person of ordinary skill in the art should recognize that other bias schemes for a form operation are possible. Referring to FIG. 11B, a maximum voltage across the gate of any of unselected memory cells is less than 2V compared to over 3.5V drop across the gate dielectric observed in memory cell 100.

Figures 12A, 12B:
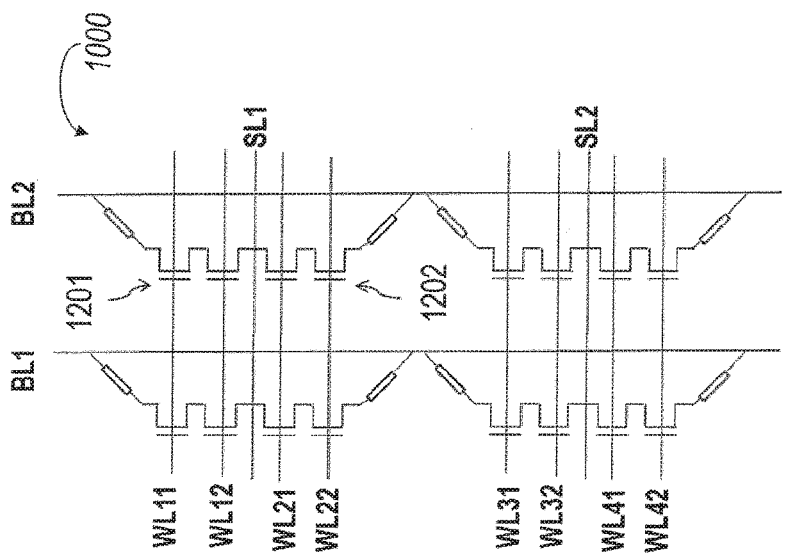
FIG. 12A is a diagram of an embodiment of a 2T-1R memory array.
FIG. 12B is a table with exemplary biases for a reset operation for the 2T-1R memory array shown in FIG. 11A.

FIG. 12B is an exemplary bias scheme for a reset operation performed in parallel on memory cells 1201 and 1202 shown in FIG. 12A. In an embodiment, memory cells other than memory cells 1201 and 1202 may be reset in parallel with memory cells 1201 and 1202. A person of ordinary skill in the art should recognize that other bias schemes for a reset operation are possible. The reset operation may be performed in parallel on a portion of the plurality of memory cells in array 1200 such that all bits in a certain section of the memory array 1200 may be reset and only a few selected cells may then be set to store the desired bit pattern.

Figures 13A, 13B:
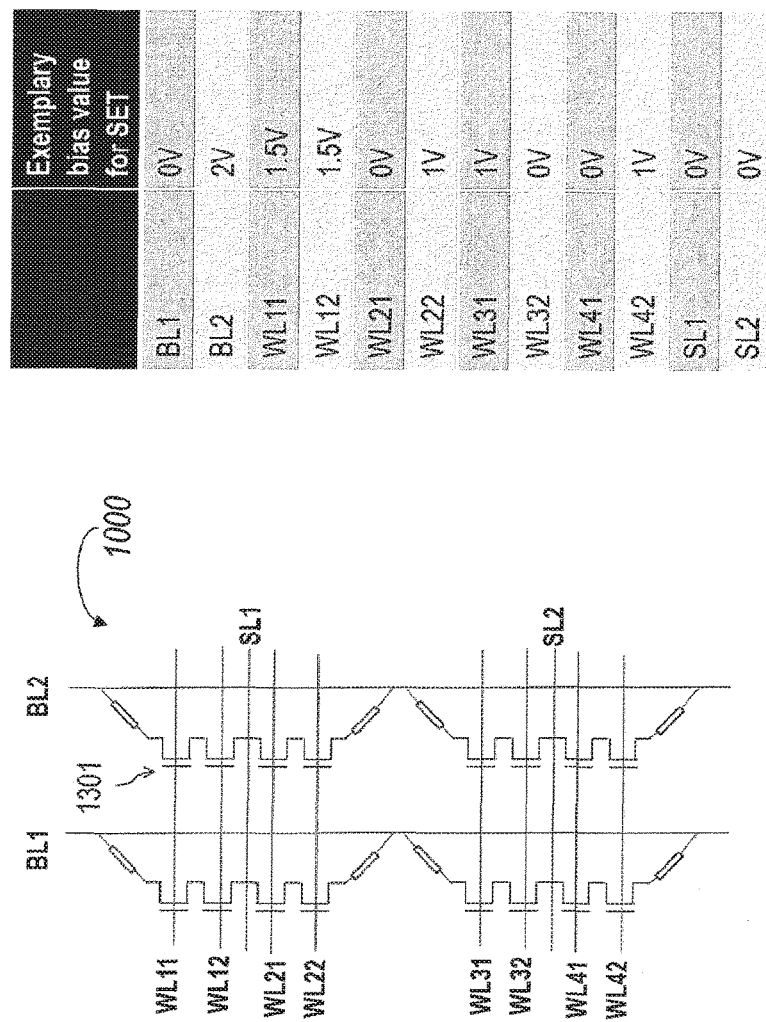
FIG. 13A is a diagram of an embodiment of a 2T-1R memory array.
FIG. 13B is a table with exemplary biases for a set operation for the 2T-1R memory array shown in FIG. 11A.
Figures 14A, 14B:
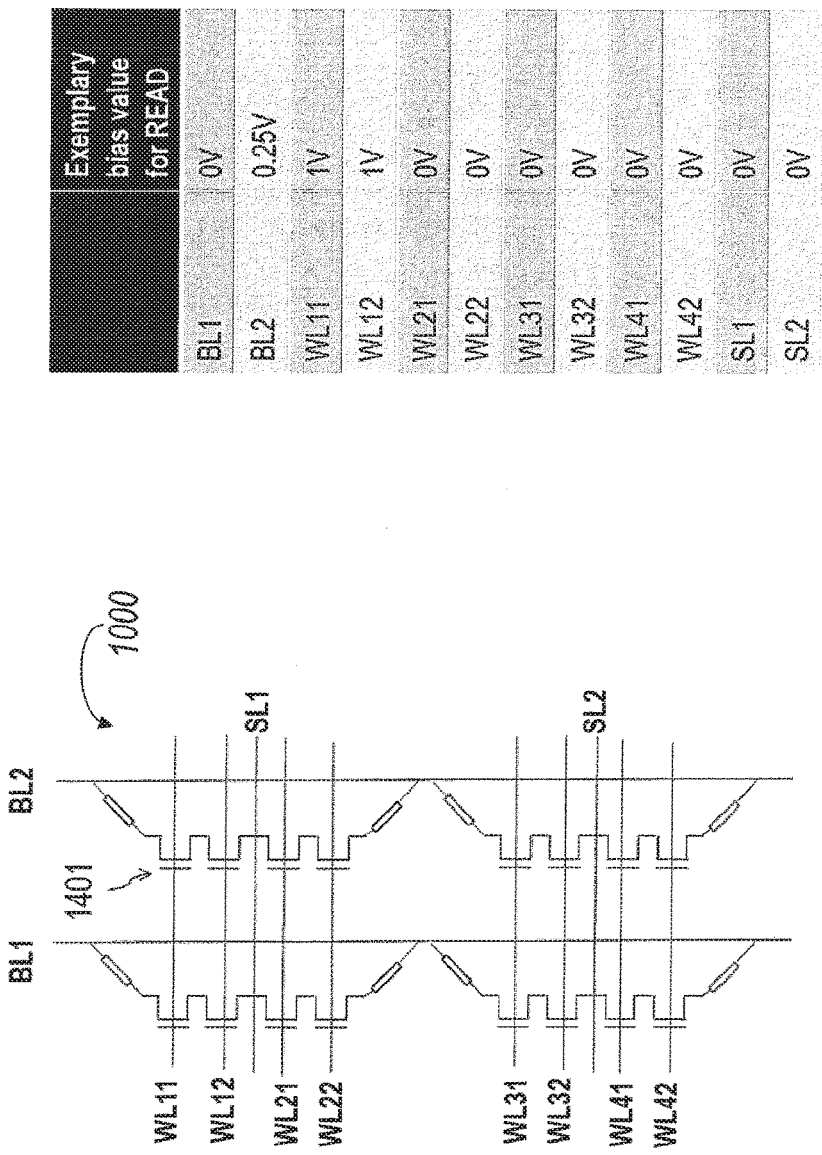
FIG. 14A is a diagram of an embodiment of a 2T-1R memory array.
FIG. 14B is a table with exemplary biases for a read operation for the 2T-1R memory array shown in FIG. 11A.

FIG. 13B is an exemplary bias scheme for a set operation performed on memory cell 1301 shown in FIG. 13A. A person of ordinary skill in the art should recognize that other bias schemes for a set operation are possible. Referring to FIG. 13B, a maximum voltage across the gate of any of unselected memory cells is less than 2V allowing for the use of smaller select transistors than is otherwise possible. FIG. 14B is an exemplary bias scheme for a read operation performed on memory cell 1401 shown in FIG. 14A. A person of ordinary skill in the art should recognize that other bias schemes for a read operation are possible.

In resistive memory devices including arrays such as those described above, it becomes important to control the current flowing through the memory devices during certain operations, e.g., during form and set operations. Doing so allows for the production of a conduction path or filament having a controlled cross-sectional area. Capacitance in the bit line and source line buses, the sense amplifier, and surge currents produced in the memory cell itself result in a difficult current control. If for example, the current flowing through the memory device is high during set or form operations, the operable reset current may problematically increase, which, in turn, may cause an increase in die size and an increase in power requirements due to the need for wider select and periphery transistors. If, for another example, the current flowing through the memory device is low due to the existence of an ineffective current limiting circuit, data retention issue may exist.

U.S. patent publication 2013/0215669 discloses a current flowing through a memory element in association with switching the memory element from the high resistance state to the low resistance state. Namely, in response to the switching, a magnitude of the current flowing through the memory element increases by the ratio of the resistance change. This current flow may cause the filament in the conduction path to grow in size, which can increase a threshold or operable reset current required to switch back to the high resistance state. U.S. patent publication 2013/0215669, which is herein incorporated by reference in its entirety, discloses biasing the select MOS transistor in a 1T-1R memory cell into saturation to act as a current source in order to limit the RRAM element current in a set operation when the element switches from a high resistance state to a low resistance state.

Figure 15A:
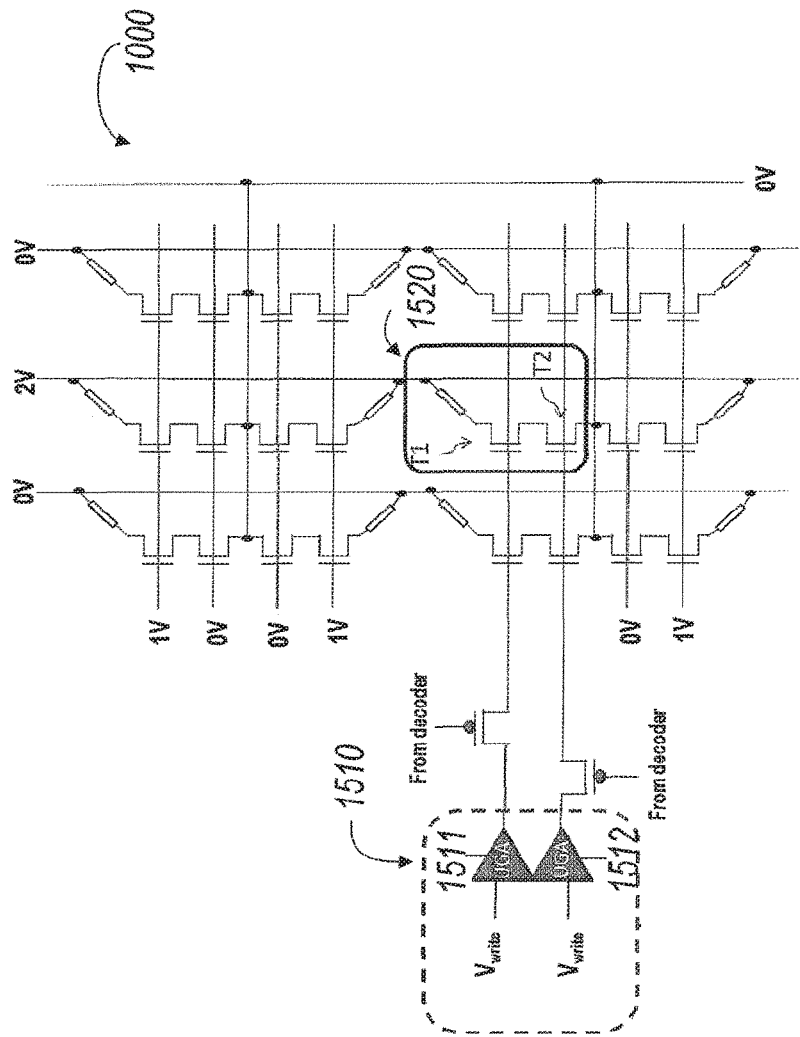
FIG. 15A is a diagram of an embodiment of a 2T-1R memory array including an embodiment of current limiting selector circuit.
Figure 15B:
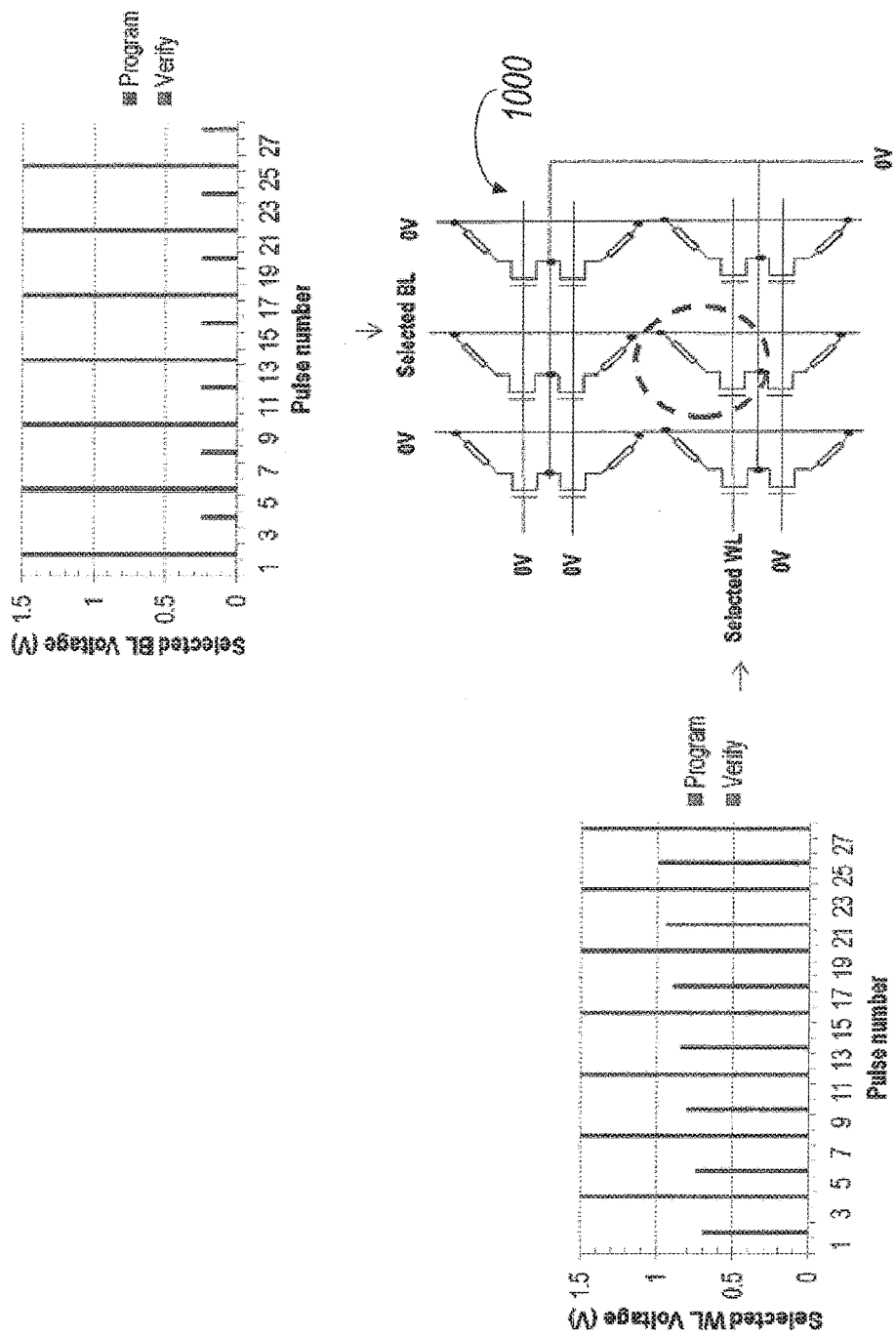
FIG. 15B is a diagram illustrating bit line and word line pulses applied to selected memory cells in the 2T-1R memory array shown in FIG. 15A.

FIG. 15A is a diagram of a portion of 2T-1R memory array 1000 (shown in FIG. 10) including an embodiment of current limiting selector circuit 1510. FIG. 15B is a diagram illustrating bit line and word line pulses applied to a selected memory cell in the 2T-1R memory array shown in FIG. 15A. Referring to FIG. 15A, current limiting selector circuit 1510 may optionally include a first unity gain amplifier 1511 and a second unity gain amplifier 1512 to isolate the gate of select transistors T1 and T2 from the circuitry applying the word line voltage. The word line voltage is chosen such that the current flowing through the memory element is limited.

Referring to FIGS. 15A and 15B, a control circuit (not shown) applies a bit line voltage as a bit line signal to the memory array including selected memory cell 1520. The control circuit also applies an initial word line voltage $V_{write}$ as a word line signal to one or both select transistors, e.g., transistors T1 or T2, of selected memory cell 1520 through current limiting selector circuit 1510. The control circuit may perform a verify read operation on the selected memory cell 1520 to verify a predetermined target resistance value for the memory cell 1520 by applying a read bit line voltage and a read word line signal. If selected memory cell 1520 has not yet reached the target resistance value, control circuit may increase the initial word line voltage $V_{write}$ and apply the increased word line voltage $V_{write}$ to one or both select transistors, e.g., transistors T1 or T2 through the current limiting circuit 1510. In other embodiments, a same value of $V_{write}$ may be re-applied to one or both select transistors, e.g., transistors T1 or T2 to allow for filament formation. The control circuit may perform another verify read operation on selected memory cell 1520 to verify a target resistance value. The control circuit may cycle through increasing the word line voltage $V_{write}$ applied to select transistors T1 and/or T2 through current limiting selector circuit 1510 and performing a verify read operation until selected memory cell 1520 reaches the target resistance value. Current limiting selector circuit 1510 limits the current through the memory cell 1520 by limiting the voltage across the gate of transistors T1 and T2.

Figure 16:
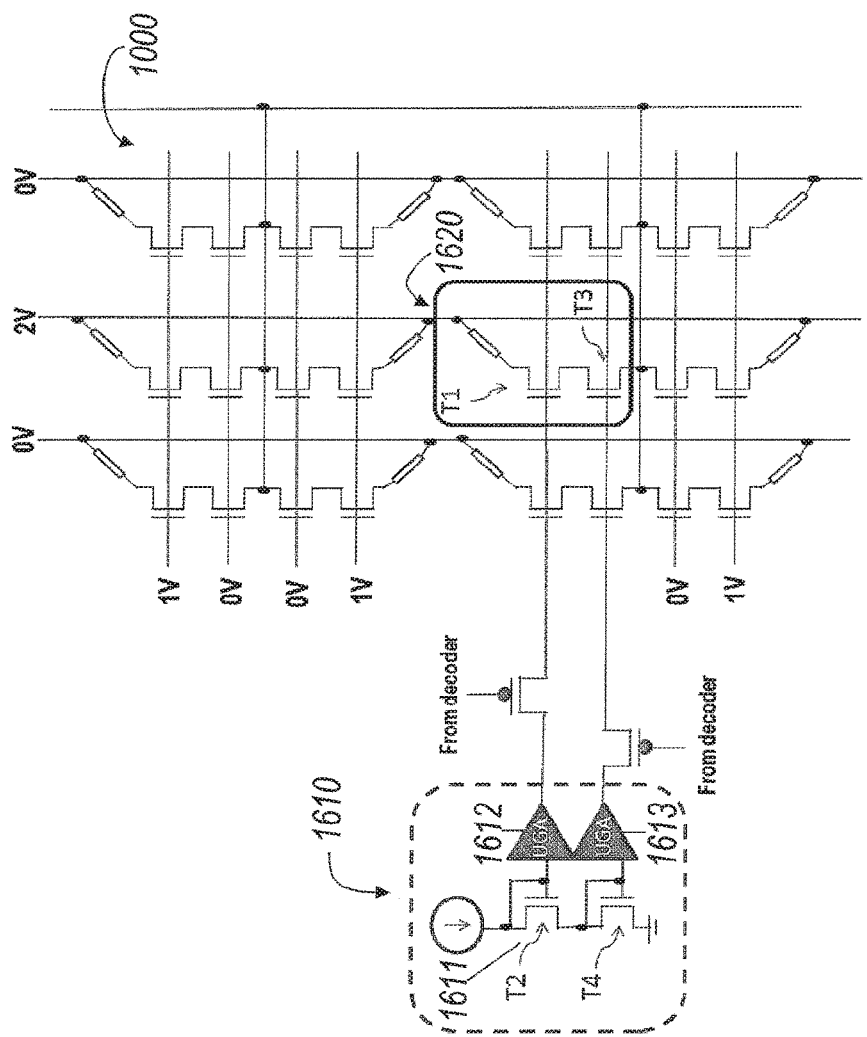
FIG. 16 is a diagram of an embodiment of a 2T-1R memory array including another embodiment of current limiting selector circuit.

FIG. 16 is a diagram of a portion of 2T-1R memory array 1000 (shown in FIG. 10) including an embodiment of current limiting selector circuit 1610. Referring to FIG. 16, current limiting selector circuit 1610 may include a current mirror 1611 coupled to optional first unity gain amplifier 1612 and second unity gain amplifier 1613 that provides a current-limited word line signal to select transistors, e.g., transistors T1 or T3, of selected memory cell 1620. As is well known to a person of ordinary skill in the art, a current mirror 1611 will provide an approximately (or relatively) constant current at its output regardless of loading. Thus, the current flowing through transistors T2 and T4 of current mirror 1611 will control the current flowing through the resistive memory element of selected cell 1620 through select transistors T2 and T3.

Figure 17:
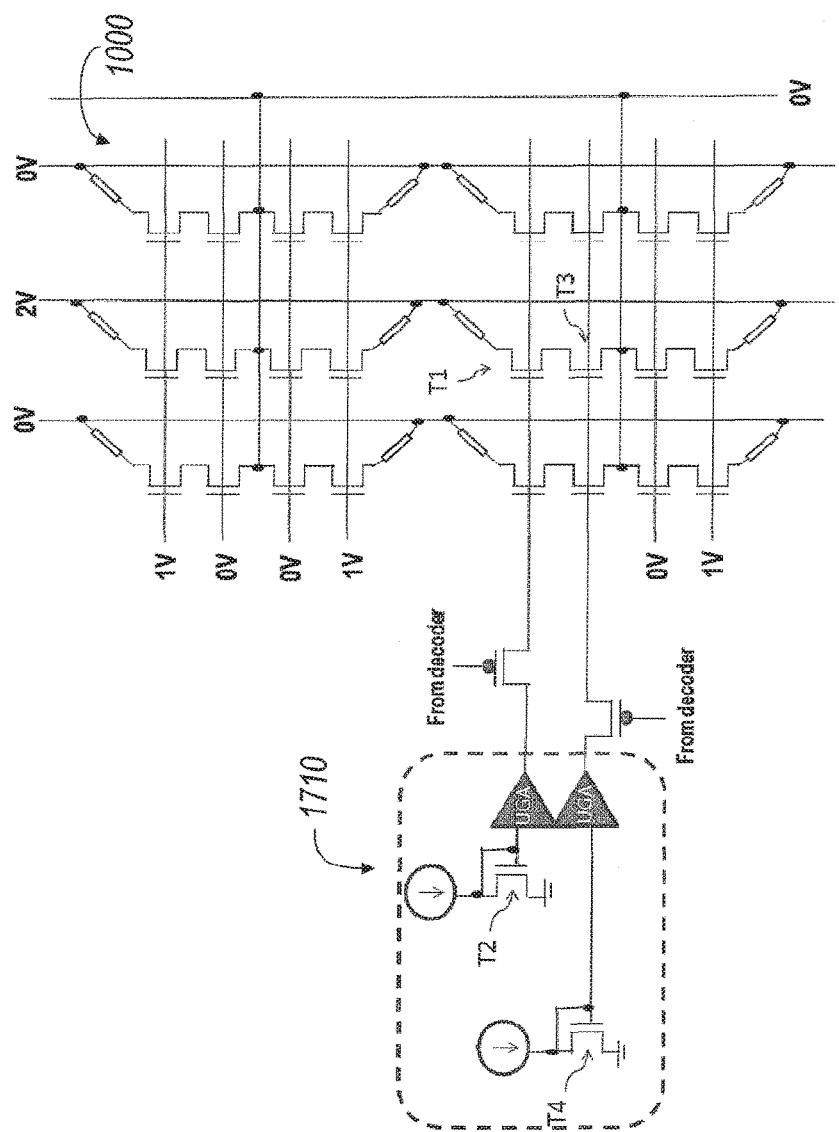
FIG. 17 is a diagram of an embodiment of a 2T-1R memory array including yet another embodiment of current limiting selector circuit.

FIG. 17 is a diagram of a portion of a 2T-1R memory array 1000 (shown in FIG. 10) including an embodiment of current limiting selector circuit 1710. Current limiting selector circuit 1710 includes independent current mirror circuits for each of select transistors T1 and T3 that could provide a better output swing than the current limiting selector circuit 1610 shown in FIG. 16.

Figure 18:
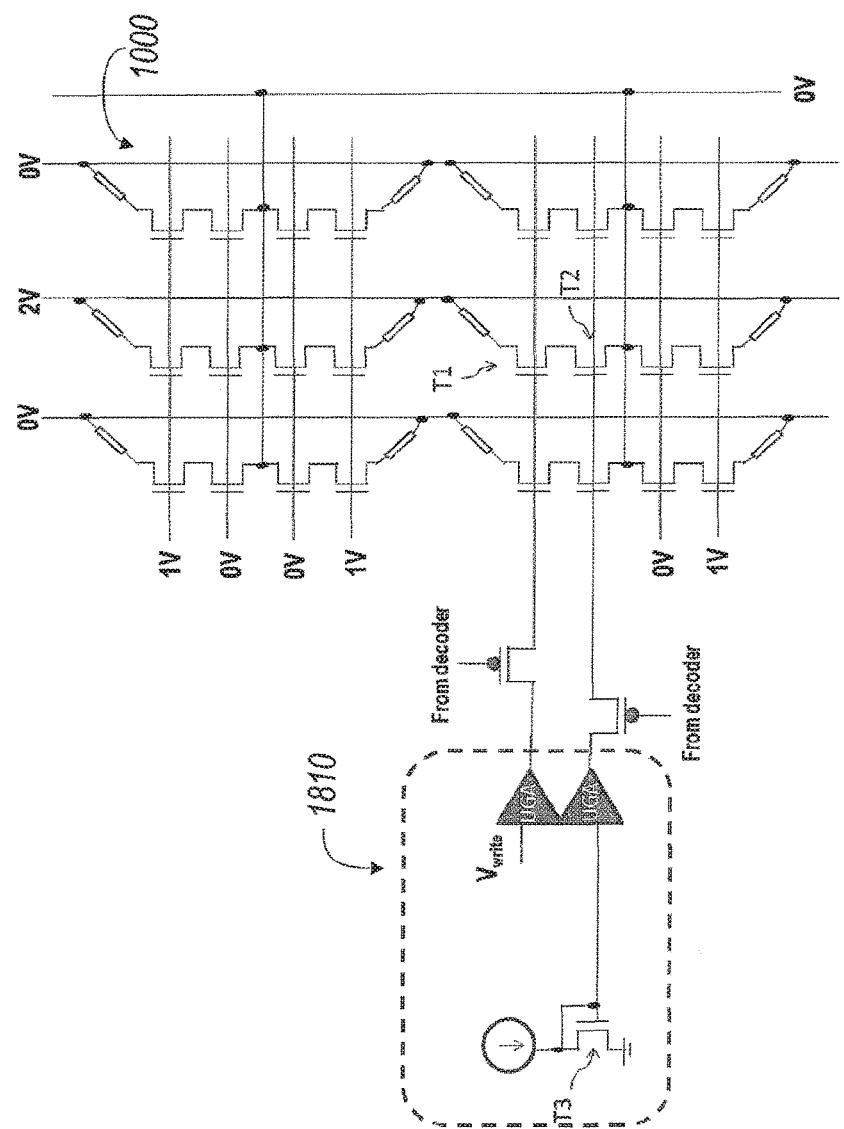
FIG. 18 is a diagram of an embodiment of a 2T-1R memory array including yet another embodiment of current limiting selector circuit.

FIG. 18 is a diagram of a portion of a 2T-1R memory array 1000 (shown in FIG. 10) including an embodiment of a current limiting selector circuit 1810. Referring to FIG. 18, current limiting selector circuit 1810 combines the application of incremental voltage pulses to one of the two select transistors, e.g., select transistor T1, and the use of a current mirror to the other of the two select transistors, e.g., select transistor T2.

Figure 19A:
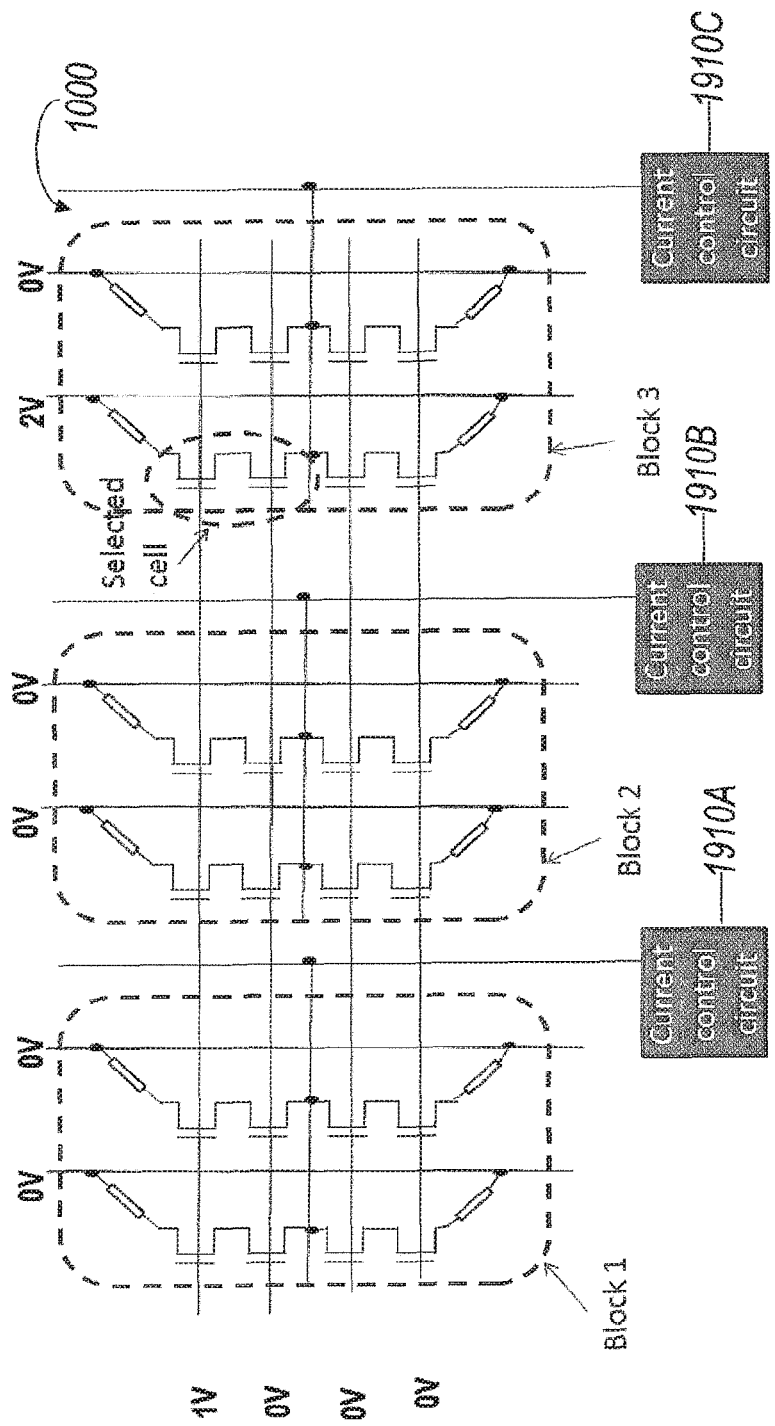
FIG. 19A is a diagram of an embodiment of a 2T-1R memory array including yet another embodiment of current limiting selector circuit.

FIG. 19A is a diagram of a portion of a 2T-1R memory array 1000 (shown in FIG. 10) including an embodiment of current limiting selector circuits 1910A, 1910B, and 1910C. In an embodiment, memory array 1000 is divided into blocks, e.g., Block 1, Block 2, and Block 3, each with its own source line current limiting circuits 1910A, 1910B, and 1910C.

As shown in FIGS. 20A-20E, a source line may be pulled low by a Metal Oxide Semiconductor (MOS) transistor biased into saturation to act as a constant current source. The gate of a cell select Field-Effect Transistor (FET), e.g. the word line, may be biased higher at greater than, e.g. a little more than, a threshold voltage above the gate of the source line pull-down transistor. The bit lines and/or word lines of the remaining cells on the source line may be biased such that they do not conduct any current.

The biasing corresponding to the selected memory cell may cause the transistor in the selected cell to pull the source line up to less than, e.g. a little less than, one voltage threshold below the word line voltage and to act as a cascode stage positioned between the source line and the memory element of the selected cell. This voltage may be sufficient to maintain the source line pull-down transistor in saturation such that it may continue to act as a constant current source independent of small fluctuations in the source-line voltage.

In this configuration, the specific voltage that will appear on the source line may vary as a function of the voltage threshold of the select transistor in the selected cell. If the voltage threshold is low, the source line may rise (charged by the cell current) until the normalized saturation drain current ($I_{DSAT}$) of the select transistor matches the $I_{DSAT}$ of the source line pull-down transistor. According, the variation of a threshold voltage of the cell select transistor (in an advanced Complementary Metal Oxide Semiconductor (CMOS) process where the variation in transistor threshold voltage from device to device can be relatively large, for example 150-200 mV) may be addressed by the self-compensating effect of the cascade configuration between the select transistor and the source line pull-down transistor.

Figure 19B:
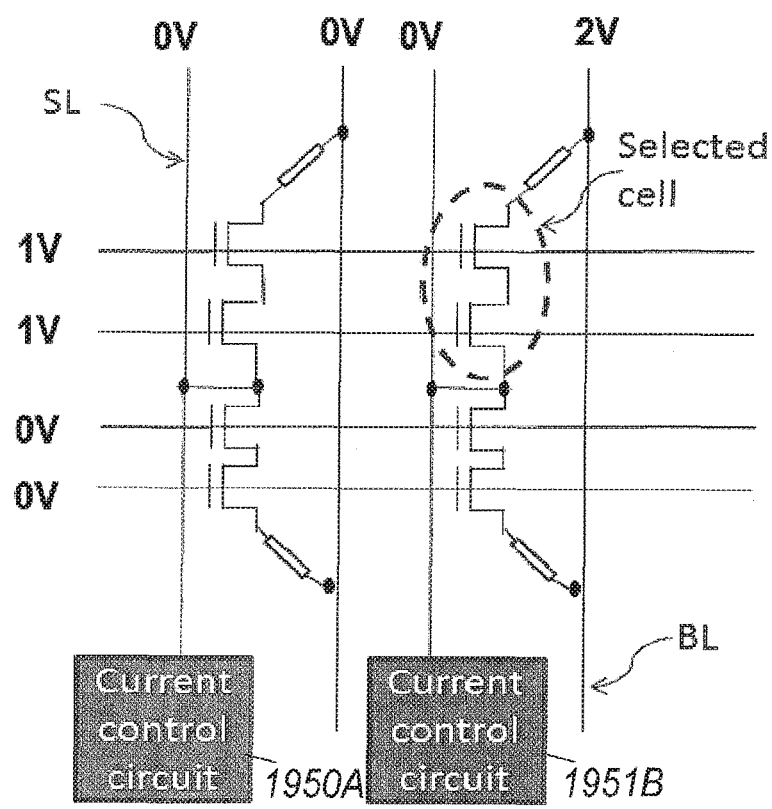
FIG. 19B is a diagram of an embodiment of a 2T-1R memory array including yet another embodiment of current limiting selector circuit on vertical source lines.
Figure 20A:
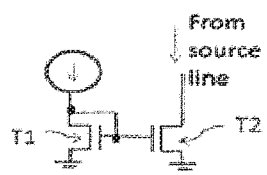
FIGS. 20A-20E are diagrams of embodiments of current limiting selector circuit.
Figure 20B:
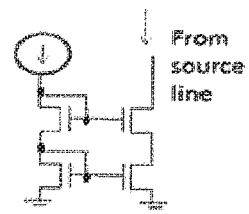
Figure 20C:
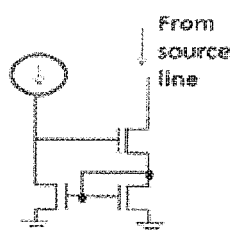
Figure 20D:
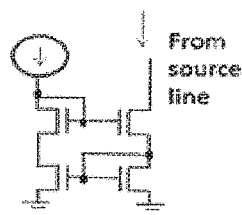
Figure 20E:
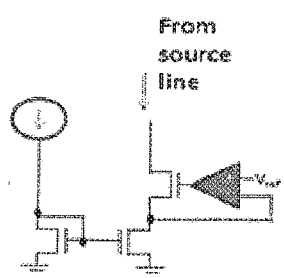

FIG. 19B is a diagram of 2T-1R memory array 1000 (shown in FIG. 10) including yet another embodiment of a current limiting selector circuit, in which the array 1000 is divided into vertical strings of memory cells, each source line signal in the string being current controlled with a corresponding current limiting selector circuit, e.g., circuits 1950A and 1950B. Embodiments of current limiting selector circuits 1910A, 1910B, 1910C, 1950A, and 1950B are shown in FIGS. 20A-20E.

Figure 21:
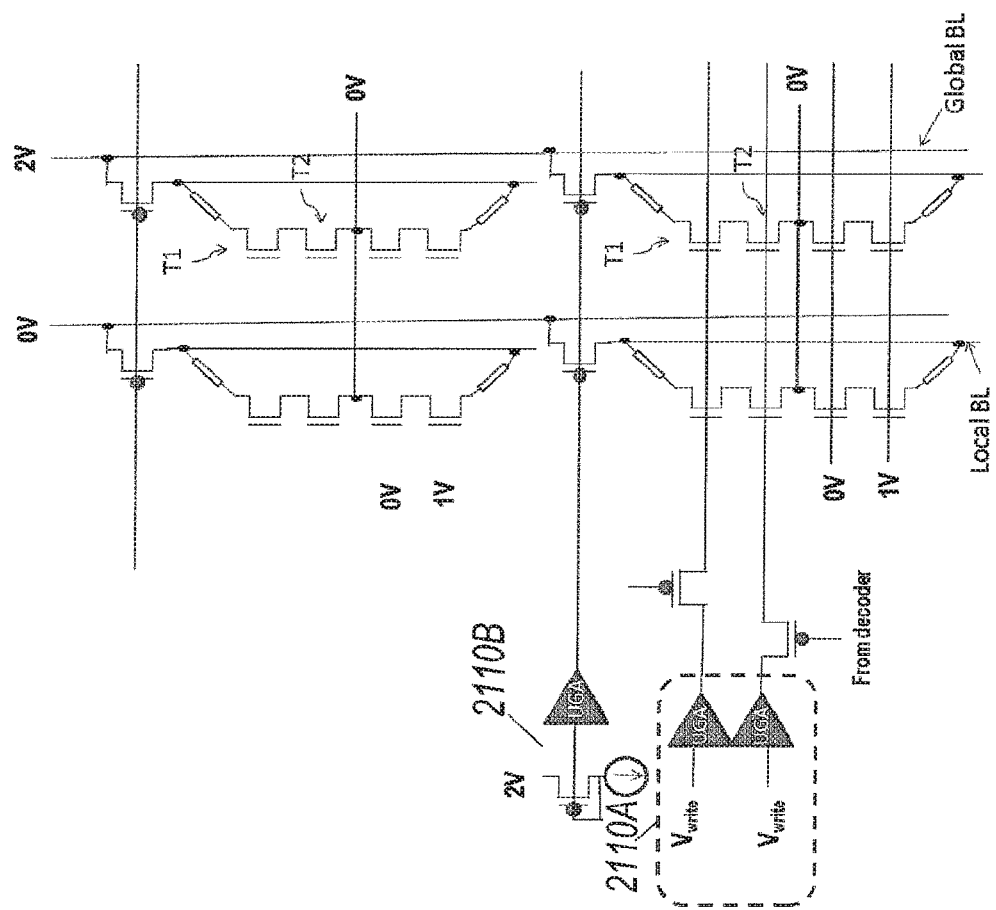
FIG. 21 is a diagram of an embodiment of a 2T-1R memory array including yet another embodiment of current limiting selector circuit.

FIG. 21 is a diagram of a 2T-1R memory array 1000 (shown in FIG. 10) including yet another embodiment of a current limiting selector circuits 2210A and 2210B. Referring to FIG. 22, select transistors between the local bit line signal LBL and the global bit line signal GBL in hierarchical bit line architecture may be used to form part of a current mirror selector circuit 2110B.

FIG. 22A is a diagram of an embodiment of a 2T-1R memory array having shared vertical source lines. Referring to FIG. 22A, memory array 2200 includes vertical source lines 2208 and source contacts—source contacts are not shown separately from source lines 2208—shared between adjacent memory cells 2202. During form or set operations shown at (A) and (B), voltage signals applied to word lines may be determined using the current mirror circuits as described earlier. During a reset operation shown at (C), two adjacent memory cells 2202 may be written in parallel by applying appropriate voltage signals to bit lines 2204 and 2206 and source lines 2208. In an embodiment, memory cells formed in adjacent rows or adjacent columns may share bit lines, source lines, source contacts, drain contacts, and the like.

In an exemplary embodiment, a reset operation may be performed in parallel on a portion of the plurality of memory cells in array 2200 such that all bits in a certain section of the memory array 2200 may be reset and only a few selected cells may then be set to store the desired bit pattern. When a certain byte has to be written, bits are reset during a reset operation optionally performed on several memory cells in parallel followed by setting just the bits needed during a set operation performed subsequent to the reset operation. Exemplary bias voltage signals are shown for memory array 2200 during a read operation at (D).

FIG. 22B is a diagram of an embodiment of a 2T-1R memory array with row drivers and exemplary biases for various operations. Referring to FIG. 22B, 2T-1R memory array 2200 includes a plurality of memory cells 2202 memory cells 2411, 2412, 2421, and 2422. Note that only a portion of memory array 2400 is shown for simplicity: memory array 2400 may include many more memory cells than just the four memory cells 2411, 2412, 2421, and 2422 shown. The tables to the right and below memory array 2400 list voltage signal levels for various signals provided to memory array 2400 by row driver/decoder circuits 2455 and 2465 (FIG. 22B(A)) during the various indicated operations.

Note that only a portion of memory array 2200 is shown for simplicity: memory array 2200 may include many more memory cells than just those shown in FIG. 22B(A). The tables below memory array 2200 list voltage signal levels for various signals provided to memory array 2200 by row driver/decoder circuits 2255 and 2265 (FIG. 22B(A)) during the various indicated operations.

Row driver circuit 2255 may generate word line, bit line, and source line signals to drive memory array 2200 in response to signals generated by row decoder circuit 2265. During a form operation on memory cell 2202, for example, bit line signals $BL_{SEL}$, $BL_{UNSEL}$ and $BL_{HALFSEL}$ are set to 4V, 0V, and 0V, respectively, while source line signals $SL_{SEL}$ and $SL_{UNSEL}$ are both set to 0V. Word line signals $N_{SL\_SIDE\_WL}$ and $N_{BL\_SIDE\_WL}$ are set to 0V and 2V, respectively. In an embodiment, row driver/decoder circuits 2255 and 2265 may include any of the current mirror circuits described above with reference to FIG. 15A, 15B, 16-19, or 20A-E. During form or reset operations, row driver/decoder circuit 2455 may provide word line signals $P_{SL\_SIDE\_WL}$ and $P_{BL\_SIDE\_WL}$ corresponding to a selected memory cell to memory array 2200.

Row driver circuit 2255 may be driven by row decoder circuit 2265 as shown. In an embodiment, row decoder circuit 2265 may include core transistors and, at a final stage, a voltage level shift circuit that is capable of shifting a first voltage level to a second voltage as is well known to a person of skill in the art. In an embodiment, row decoder circuit 2265 may include non-core transistors capable of sustaining the larger voltage signals necessary to drive selected word line signals without need for a voltage level shift circuit. Row driver/decoder circuits 2255 and 2265 may generate the voltage signals shown at (B) by including any of a variety of circuits, e.g., digital to analog converters (DACs) that operate off voltage values set in registers, charge pumps, bootstrapping circuits to drive the higher voltages and reduce requirements for charge pumps, unity gain amplifiers to drive the voltage signals for vertical lines, and the like. A person of ordinary skill in the art would understand that other circuits and variations are possible including using hierarchical word line, bit line, and source line architectures.

FIG. 22C is a diagram of an embodiment of a 2T-1R memory array with row drivers and exemplary biases for various operations. Referring to FIG. 22C, memory array 2200 may be coupled to a current limiting circuit to limit the current delivered to memory cell 2202 to avoid gate oxide breakdown of memory cell 2202. In an embodiment, a current limiting circuit may be coupled to the bit line driver 2270 and to the select transistors in memory cell 2202 and may include transistors 2290, 2292, and 2294. The current limiting circuit may optionally include unity gain amplifiers 2282, 2284, and 2286 to drive the large capacitive load of the shared wires.

Referring back to FIG. 4B, control circuit 450 provides the word line signals, bit line signals, and word line signals to the memory array 400. In an embodiment, control circuit 450 avoids voltage or current stresses on select transistors T1 and T2 that would result in damage, wear out, reduced life, or the like, by applying the necessary voltage signals in predetermined levels and/or in a predetermined sequence as further described below.

Figure 23A:
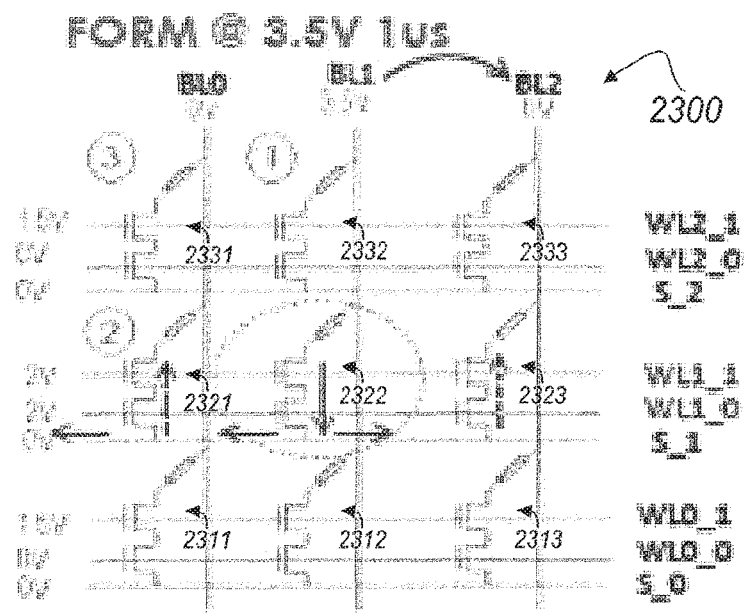
FIG. 23A is a diagram of an embodiment of a voltage signal sequence applied to a 2T-1R memory device during a form operation.
Figure 23B:
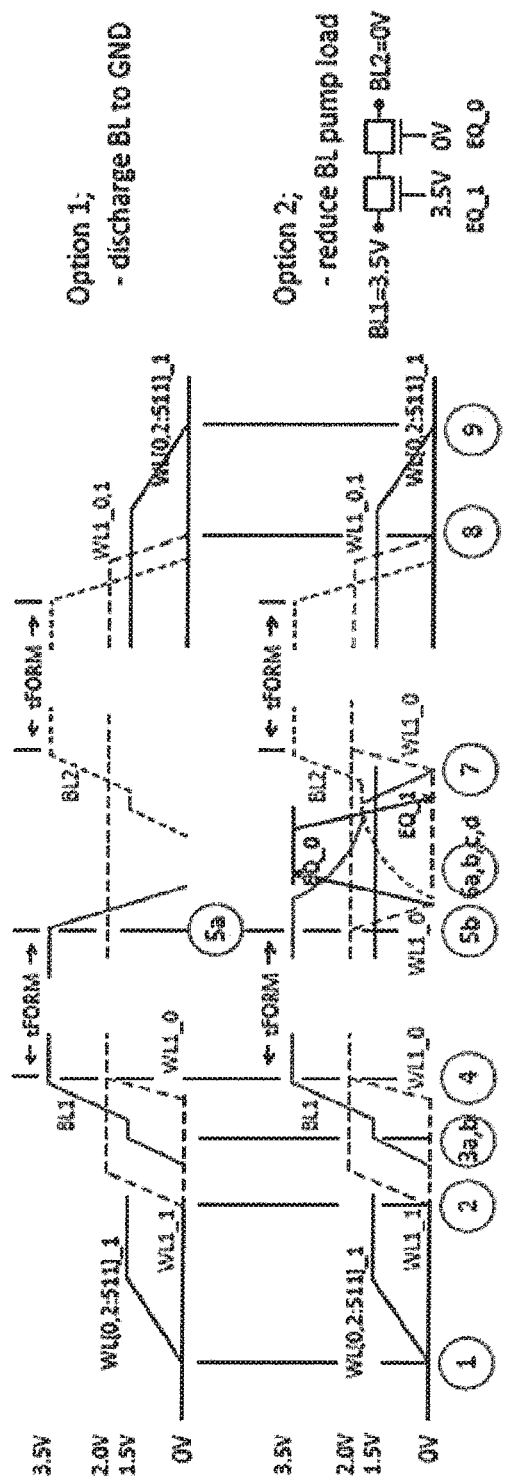
FIG. 23B is a timing diagram of an embodiment of the voltage signal sequence applied to a 2T-1R memory device shown in FIG. 23A during a form operation.

FIG. 23A is a diagram of an embodiment of a portion of a 2T-1R memory array 2300 during a fatal operation. FIG. 23B is a timing diagram of an embodiment of a voltage signal sequence applied to the 2T-1R memory array shown in FIG. 23A during the form operation. Referring to FIGS. 23A and 23B, a portion of memory array 2300 includes a 3×3 matrix of 2T-1R memory cells 2311, 2312, 2313, 2321, 2322, 2323, 2331, 2332, and 2333. Each of the memory cells 2311, 2312, 2313, 2321, 2322, 2323, 2331, 2332, and 2333 may have a construction like that of memory cell 400 shown in FIG. 4A including, in some embodiments, using thin oxide devices for select transistors 402 and 403. In an embodiment including 512 bits per bit line, memory array 2300 is configured to receive a plurality of voltage signals, e.g., bit line signals BL0:511, pairs of first and second word line signals WL0:511_0, 1, and source line signals S_0:511 from a control circuit, e.g., control circuit 450 shown in FIG. 4B. For simplicity of explanation, the portion of memory array 2300 including 2T-1R memory cells 2311, 2312, 2313, 2321, 2322, 2323, 2331, 2332, and 2333 shown in FIG. 23A is configured to receive bit line signals BL0:2, pairs of first and second word line signals WL0:2_0, 1, and source line signals S_0:2.

A form operation is typically performed once on a memory device during its manufacture. In an embodiment in which a form operation is performed on selected memory cell 2322, control circuit 450 (FIG. 4B) may apply the sequence of voltage signals to memory array 2300 as follows:

At step 0, maintain first word line signals WL0_0, WL1_0, and WL2_0 for unselected memory cells 2311, 2312, 2313, 2331, 2332, and 2333, and all source line signals S_0, Si, and S_2 to a ground voltage.

At step 1, charge second word line signals WL0_1 and WL2_1 corresponding to unselected memory cells 2311, 2312, 2313, 2331, 2332, and 2333 to a first word line voltage, e.g., 1.5V.

At step 2, set second word line signal WL1_1 corresponding to selected memory cell 2322 to a second word line voltage higher than a first word line voltage, e.g., 2V.

At steps 3a and 3b, provide an intermediate bit line voltage, e.g., 1.5V, to bit line signal BL1 (step 3a) corresponding to selected memory cell 2322, and boost the intermediate bit line voltage, e.g., 1.5V, provided to the bit line signal BL1 to boosted bit line voltage, e.g., 3.5V (step 3b) using, e.g., a charge pump circuit.

At step 4, set first word line signal WL1_0 corresponding to selected memory cell 2322 to a second word line voltage, e.g., 2V to coincide with boosted bit line signal BL1 approaching the 3.5V level. This step begins formation of the memory element included in selected memory cell 2322.

At step 5a, discharge bit line signal SL1 corresponding to selected memory cell 2322 to ground voltage to end forming of the memory element included in selected memory cell 2322 (Voltage Sequence Option 1).

Alternatively, at step 5b, discharge first word line signal WL1_0 corresponding to selected memory cell 2322 to a ground voltage to end the forming the memory element included in selected memory cell 2322 (Voltage Sequence Option 2).

Steps 6a to 6d more particularly describe step 5b transition to step 7 for the Voltage Sequence Option 2, which alternative operation provides for lower voltage pump loading.

At step 6a, disconnect pumped voltage source from bit line BL1 after first word line signal WL1_0 is discharged to a ground voltage.

At step 6b, set bit line equalization signal EQ_0 to a boosted voltage 3.5V and charge share bit line signals BL1 and BL2 such that remaining charge on bit line signal BL1 is shared by bit line signal BL2 resulting in a voltage of e.g., 1.75V.

At step 6c, set bit line equalization signal EQ_1 to a ground voltage and isolate bit line signal BL1 from bit line signal BL2.

At step 6d, discharge bit line signal BL1 corresponding to selected memory cell 2322 to a ground voltage and charge bit line signal BL2 from e.g., 1.75V to the boosted bit line voltage, e.g., 3.5V, saving load on the bit line 3.5V charge pump.

At step 7, for Voltage Sequence Option 1, both word line signals WL1_0,1 have remained at 2V after bit line signal BL1 was discharged to ground. The forming for memory element 2323 begins when bit line signal BL2 is charged to 3.5V as per steps 3a and 3b. For Voltage Sequence Option 2, after bit line signal BL2 has been charged to 3.5V, set first word line signal WL1_0 corresponding to selected memory cell 2323 is set to a second word line voltage, e.g., 2V. This begins formation of the memory element of selected memory cell 2323 for Option 2.

The result is that the exemplary sequences (Voltage Sequence Options 1 and 2) limit voltage or current stresses by controlling the signals provided to select transistors corresponding to memory cells selected for a form operation, e.g., memory cell 2322 or memory cell 2323, since no current flows through the select transistor corresponding to the selected memory cell until the first word line signal, e.g., WL1_0, is active. Note that the exemplary sequence allows for control of the memory element formation time $t_{form}$ by either turning off the bit line signal corresponding to the selected memory cell, e.g., bit line signal BL1 (Option 1), or turning off the first word line signal WL1_0 corresponding to the selected memory cell (Option 2).

In Voltage Sequence Option 1, the formation of the memory element for the selected memory cell ends by turning off (or discharging to a ground voltage) the corresponding bit line signal BL1. The number of memory elements in array 2300 that can be formed in parallel may depend on the capacity of the charge pump (not shown) to maintain forming currents while charging the bit lines from an intermediate bit line voltage of, e.g., 1.5V, to a boosted bit line voltage of e.g., 3.5V.

In Voltage Sequence Option 2, the formation of the memory element corresponding to the selected memory cell ends by control of the corresponding first word line signal WL1_0. The sequencing of bit line equalization signals EQ_0 and EQ_1 to share charge between bit line signals BL1 and BL2, such that bit line signal BL2 is charged up to an intermediate bit line voltage, e.g., 1.5V or 1.75V, before being boosted to a boosted bit line voltage of, e.g., 3.5V reduces noise of the charge pump supply voltage line to provide consistent forming currents to the memory element for the selected memory cells.

An alternative sequence may include pre-charging the bit line signal BL2 corresponding to a memory cell selected to be formed next to the intermediate bit line voltage, e.g., 1.5V, sharing charge between the bit line signal BL1 corresponding to the memory cell currently being formed and the bit line signal BL2 corresponding to the memory cell to be formed next by sequencing the bit line equalization signals EQ_0 and EQ_1, and finishing charging the bit line signal BL2 from the shared charge bit line voltage, e.g., 2V to the boosted bit line voltage of 3.5V, which may further reduce charge pump loading.

After completing the form operation, discharge the last bit line signal and first and second word line signals WL0_0, WL1_0, WL2_0, WL0_1, WL1_1, WL2_1 to ground.

Figure 23C:
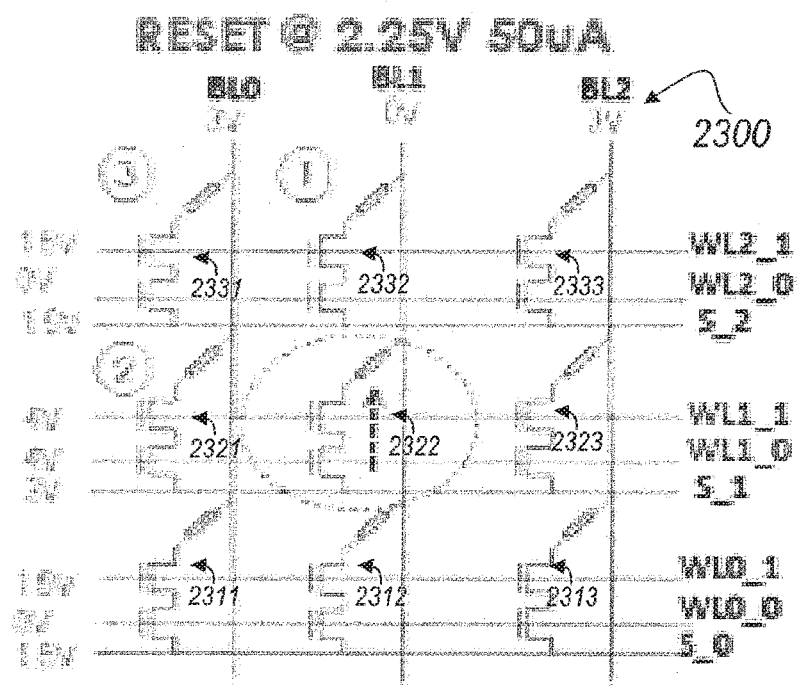
FIG. 23C is a diagram of an embodiment of a portion of a 2T-1R memory array 2300 during a reset operation.
Figure 23D:
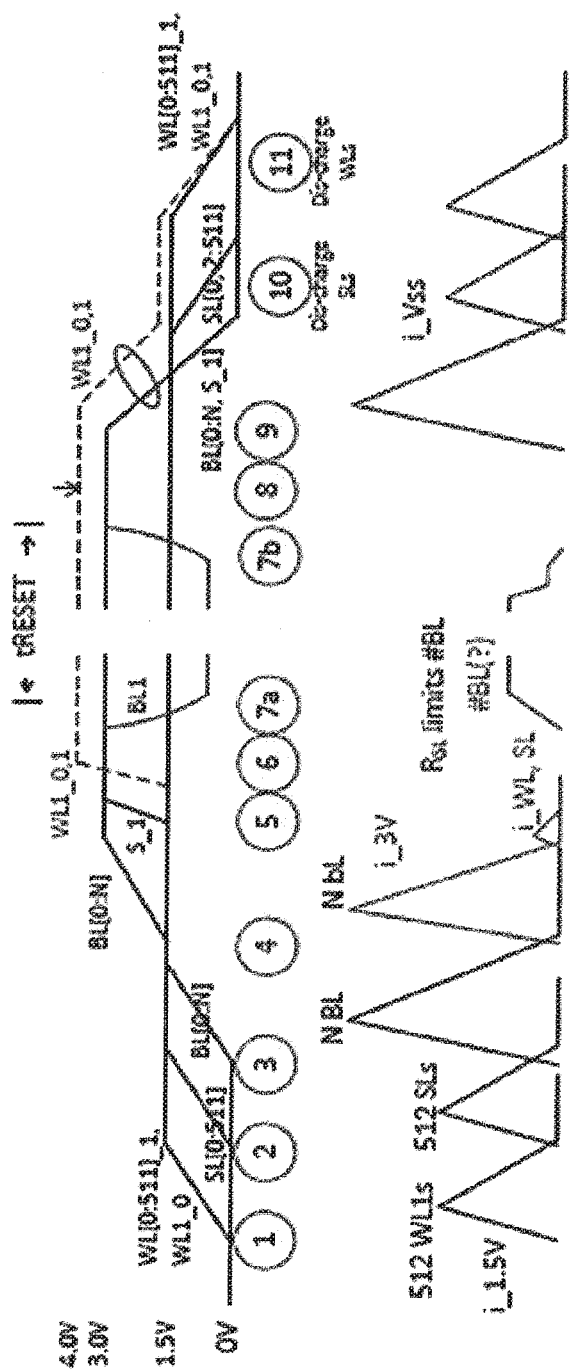
FIG. 23D is a timing diagram of an embodiment of a voltage signal sequence applied to the 2T-1R memory array shown in FIG. 23C during the reset operation.

FIG. 23C is a diagram of an embodiment of a portion of a 2T-1R memory array 2300 during a reset operation. FIG. 23D is a timing diagram of an embodiment of a voltage signal sequence applied to the 2T-1R memory array shown in FIG. 23C during the reset operation. Referring to FIGS. 23C and 23D, in an embodiment in which the reset operation is performed on memory cell 2322, the sequence of voltage signals is applied as follows:

At step 1, set first word line signal WL1_0 corresponding to selected memory cell 2322 and second word line signals WL0_1, WL1_1, WL2_1 corresponding to unselected memory cells 2311, 2312, 2313, 2321, 2323, 2331, 2332, and 2333 to a first word line voltage, e.g., 1.5V.

At step 2, set source line signals Si, S_2, S_3 to a first source line voltage, e.g., 1.5V.

At step 3, set bit line signals BL1, BL2, and BL3 to a first bit line voltage, e.g., 1.5V.

At step 4, boost the voltage at bit line signals BL0, BL2, and BL3 from a first bit line voltage, e.g., 1.5V, to a boosted bit line voltage, e.g., 3.0V using, e.g., a charge pump device.

At step 5, increase the voltage applied to the source line signal Si corresponding to selected memory cell 2322 from the first source line voltage, e.g., 1.5V, to a second source line voltage, e.g., 3V.

At step 6, increase the voltage applied to first and second word line signals WL1_0 and WL1_1 corresponding to selected memory cell 2322 from first word line voltage, e.g., 1.5V, to a second word line voltage, e.g., 4V.

At step 7a, set bit line signal BL1 corresponding to selected memory cell 2322 to a ground voltage GND (only time current flows through element) for a reset time $t_{reset}$. This step begins reset of the memory element of selected memory cell 2322.

At step 7b, set bit line signal BL1 corresponding to selected memory cell 2322 to a boosted bit line voltage, e.g., 3.5V. This step ends reset of the memory element of selected memory cell 2322.

At step 8, disconnect drivers for first and second word line signals WL1_0 and WL1_1 corresponding to selected memory cell 2322 to float first and second word line signals WL1_0 and WL1_1.

At step 9, discharge source line signal Si corresponding to selected memory cell 2322 and bit line signals BL0, BL1, and BL2.

At step 10, discharge source line signals S_0 and S_2 corresponding to unselected memory cells 2311, 2312, 2313, 2331, 2332, and 2333.

At step 11, discharge second word line signals WL0_1 and WL1_1 corresponding to unselected memory cells 2311, 2312, 2313, 2331, 2332, and 2333 and discharge first and second word line signals WL1_0 and WL1_1 to selected memory cell 2322 to a ground voltage.

The sequence of voltage signals applied to the memory array 2300 to reset selected memory cell 2322 results in moderating the instantaneous charging currents from a drain voltage, e.g., voltage Vdd. The voltage drop of 2.25V across the memory element of selected memory cell 2322 (until the filament opens) insures that the voltage between the gate receiving the second word line voltage signal WL1_1 and the drain coupled to the memory element is limited to 1.75V (4V−2.25V) until the filament opens.

After completing the reset operation, disconnect the word line driver to float the first and second word line signals WL1_0 and WL1_1 corresponding to selected memory cell 2322. At this time, discharge bit line signals BL0, BL2, and BL2 and source line signal Si to a ground voltage, e.g., Vss, coupling the first and second word line signals WL1_0 and WL1_1 corresponding to selected memory cell 2322 toward 1.5V. Next, discharge source line signals S_0 and S_2 corresponding to unselected memory cells.

The above-described voltage sequences are designed to minimize stresses induced on memory cells of the 2T-1R array in preparation for forming and reset operations. The sequence insures that the applied voltage signals produce currents that only flow through the target element of the selected memory cell during its programming, resulting in increased reliability and consistent filament control.

Referring back to FIG. 4B, control circuit 450 provides the word line signals, bit line signals, and word line signals to the memory array 400. In an embodiment, control circuit 450 includes a row driver/decoder circuit configured to generate the voltage signals applied to memory array 400 during various operations including the predetermined sequence of voltage signals described with reference to FIGS. 23A-23D and the voltage signals applied to memory array 400 to select two adjacent rows of memory array 400 for a reset operation and a single row of memory array 400 for set, form, or read operations.

Figure 24A:
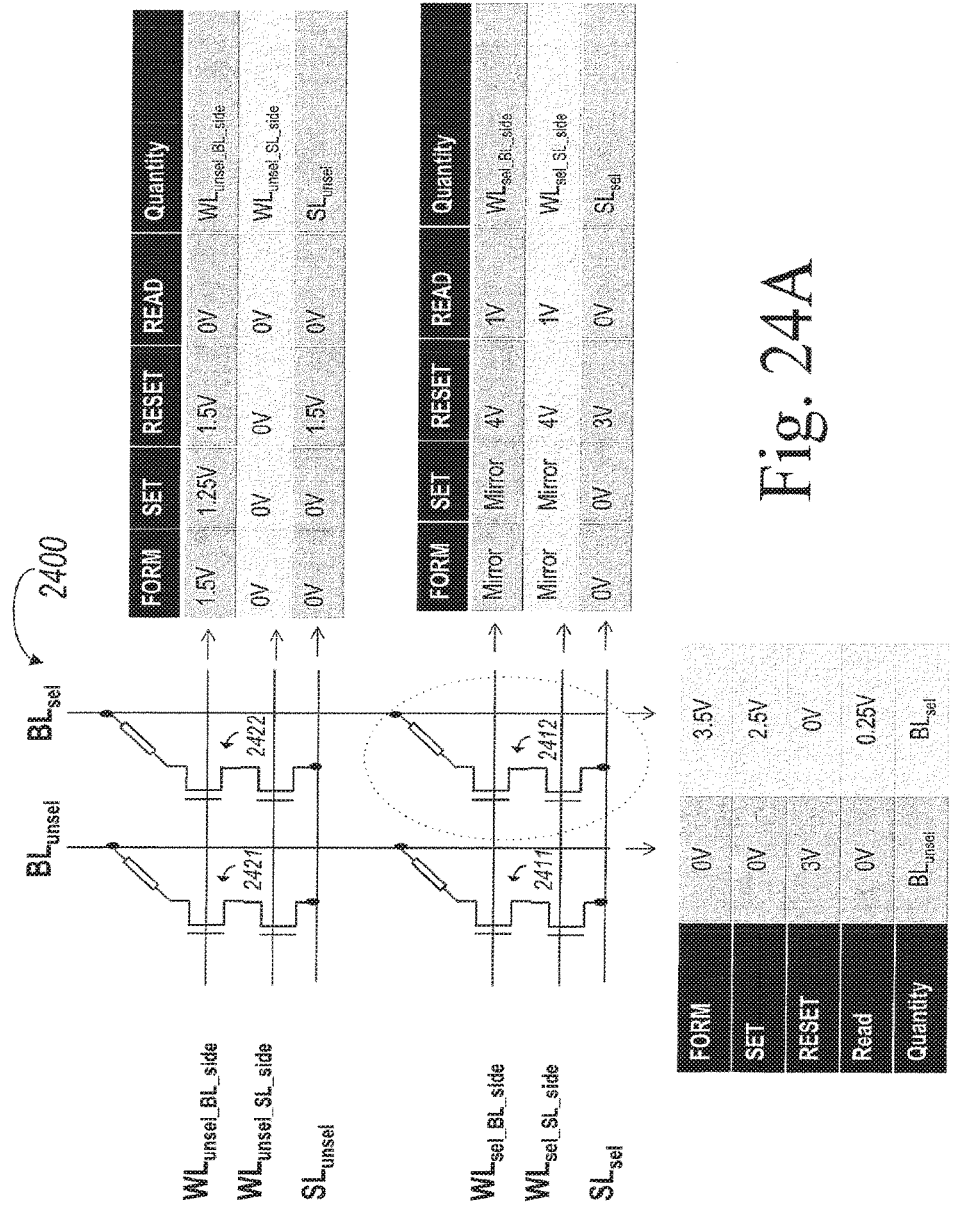
FIG. 24A is a diagram of an embodiment of a biasing scheme for various operations performed on a 2T-1R memory array.
Figure 24B:
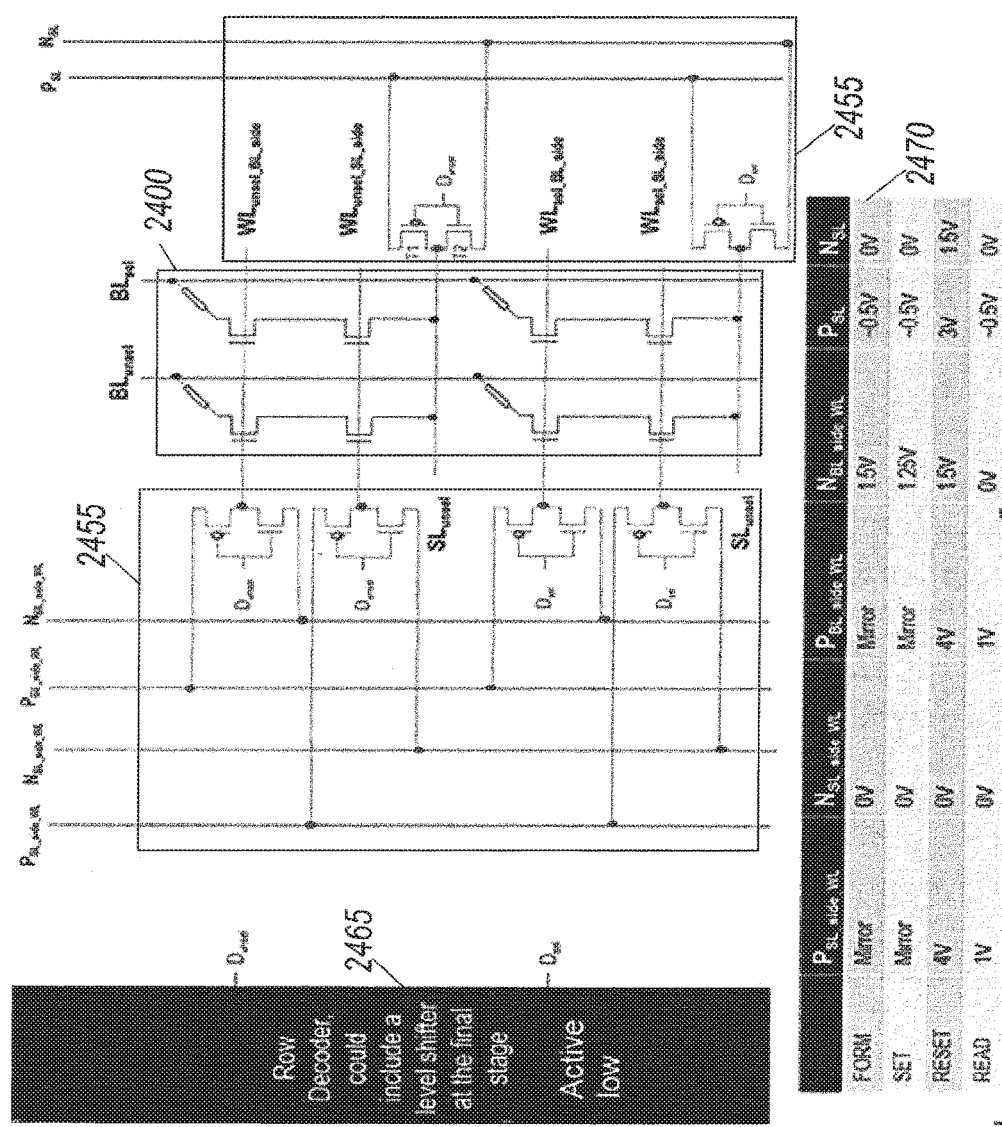
FIG. 24B is a diagram of an embodiment of row driver/ decoder circuits configured to generate the signals shown in FIG. 24A.

FIG. 24A is a diagram of an embodiment of a biasing scheme for various operations performed on a 2T-1R memory array 2400. FIG. 24B is a diagram of an embodiment of row driver/decoder circuits 2455 and 2465 configured to generate the signals shown in FIG. 24A. Referring to FIGS. 24A and 24B, 2T-1R memory array 2400 includes memory cells 2411, 2412, 2421, and 2422. Note that only a portion of memory array 2400 is shown for simplicity: memory array 2400 may include many more memory cells than just the four memory cells 2411, 2412, 2421, and 2422 shown. The tables to the right and below memory array 2400 list voltage signal levels for various signals provided to memory array 2400 by row driver/decoder circuits 2455 and 2465 (FIG. 24B) during the various indicated operations.

During a form operation, for example, memory array 2400 may receive from row driver/decoder circuits 2455 and 2465 word line signals $WL_{unsel\_BL\_side}$ and $WL_{unsel\_SL\_side}$ set to 1.5V and 0V, respectively, source line signal set to 0V, bit line signals $BL_{unsel\ and}\ BL_{sel}$ set to 0V and 3.5V, respectively, and source line signals $SL_{set}$ set to 0V.

In an embodiment, row driver/decoder circuits 2455 and 2465 may include any of the current mirror circuits described above with reference to FIG. 15A, 15B, 16-19, or 20A-E. During form or reset operations, row driver/decoder circuit 2455 may provide word line signals $WL_{sel\_BL\_side}$ and $WL_{sel\_ST\_side}$ corresponding to a selected memory cell to memory array 2400.

Figure 24C:
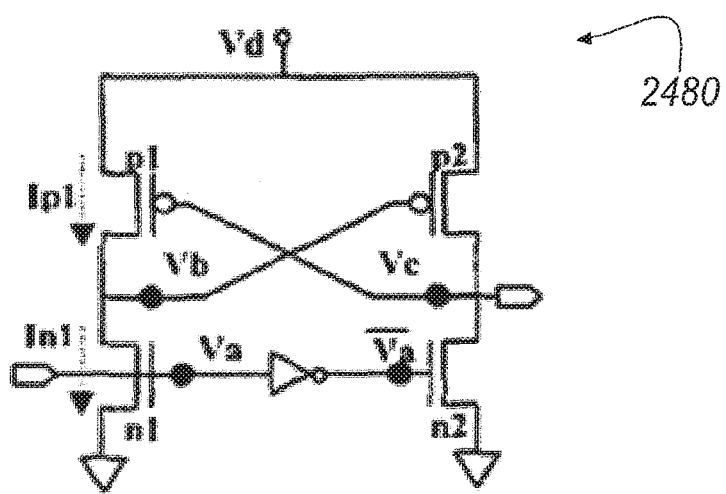
FIG. 24C is a diagram of an embodiment of a voltage level shift circuit.

Row driver circuit 2455 may be driven by row decoder circuit 2465 as shown. In an embodiment, row decoder circuit 2465 may include core transistors and, at a final stage, a voltage level shift circuit, e.g., voltage level shift circuit 2480 shown in FIG. 24C. The voltage level shift circuit may include any circuit capable of shifting a first voltage level to a second voltage that is known to a person of skill in the art. In an embodiment, the voltage level shift circuit may have a construction similar to voltage level shift circuit 2480, which is also well known to a person of ordinary skill in the art. In another embodiment, row decoder circuit 2465 may include non-core transistors capable of sustaining the larger voltage signals necessary to drive selected word line signals without need for a voltage level shift circuit. Row driver/decoder circuits 2455 and 2465 may generate the voltage signals shown in table 2470 by including any of a variety of circuits, e.g., digital to analog converters (DACs) that operate off voltage values set in registers, charge pumps, bootstrapping circuits to drive the higher voltages and reduce requirements for charge pumps, unity gain amplifiers to drive the voltage signals for vertical lines, and the like. A person of ordinary skill in the art would understand that other circuits and variations are possible including using hierarchical word line, bit line, and source line architectures.

FIG. 25A is a diagram of an embodiment of a portion of 2T-1R memory array and FIG. 25B is a diagram of layout of an embodiment of a 2T-1R memory cell included in the 2T-1R memory array shown in FIG. 25A. FIG. 26A is a diagram of an embodiment of a 2T-1R memory array having shared source lines and FIG. 26B is a diagram of layout of an embodiment of the 2T-1R memory cell shown in FIG. 26A. The portions of the memory arrays shown in FIGS. 25A and 26A have been fully described previously with relation to various drawings, including FIGS. 4, 9, and 1000. Each memory cell in array 2500 has a corresponding source line while memory cells in adjacent rows of array 2600 share a same or common source line. As shown by comparing FIGS. 25B and 26B, sharing source lines between memory cells in adjacent rows may result in a reducing a size of a memory cell from e.g., a memory cell having dimensions 328 nm×140 nm (FIG. 25B) to a memory cell having dimensions 278 nm×140 nm (FIG. 26B).

2T-1R memory arrays having shared source line architectures like memory array 2600 may subject memory cells during reset operations to voltage stresses that cause oxide breakdown in thin oxide devices.

Figure 26C:
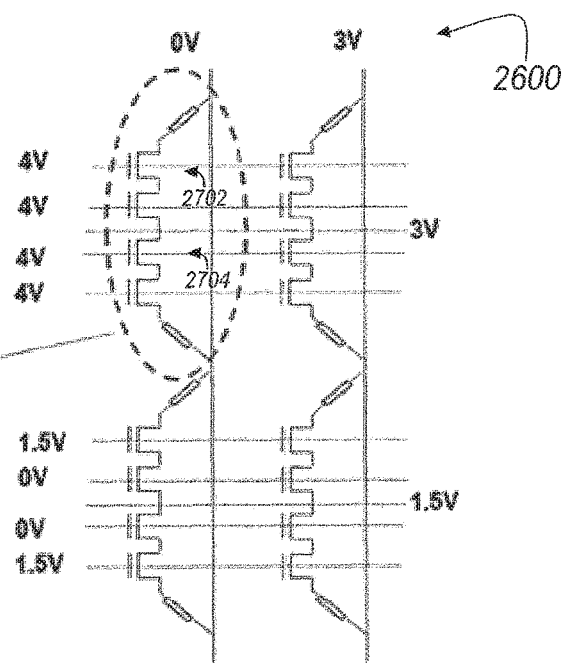
FIG. 26C is a diagram of an embodiment of a byte-level flash reset to avoid the gate oxide breakdown shown in FIG. 26C.

Byte-level flash reset, as we explain below, prevents high voltage stress conditions that may cause oxide breakdown in thin oxide devices. Referring to FIG. 26C, oxide breakdown of unselected memory cells may be avoided by using a byte-level flash reset of adjacent rows of memory cells. None of the select transistors in either of memory cells 2702 and 2704 are subject to voltage stresses that could result in oxide breakdown. Following the byte level flash reset, set operations may be performed as necessary.

Figure 27B:
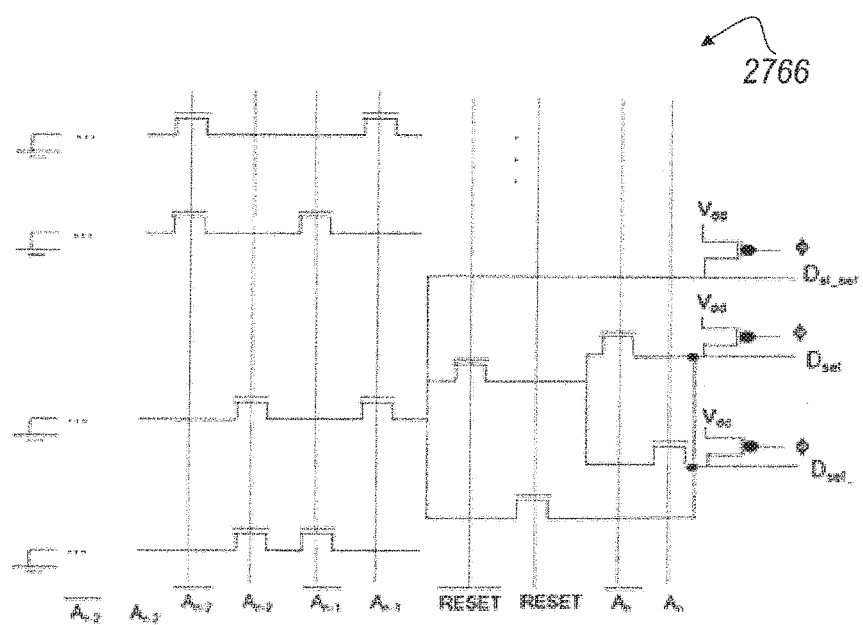
FIGS. 27B and 27C are diagrams of embodiments of row decoder circuit 2765.
Figure 27C:
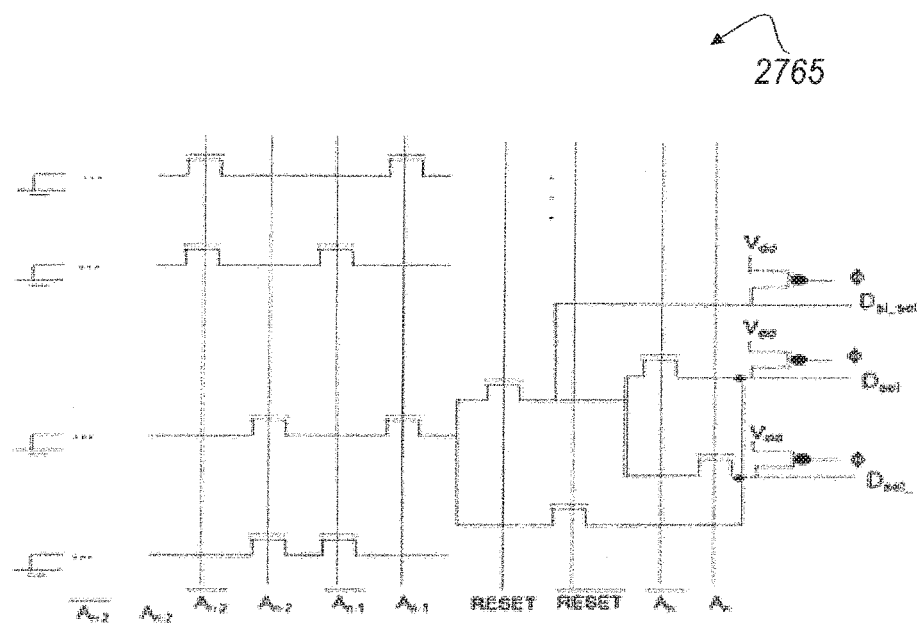

FIG. 27A is a diagram of an embodiment of row driver circuit 2755 configured to generate the flash reset signals shown in FIG. 26C. FIGS. 27B and 27C are diagram of embodiments of a row decoder circuit 2765, whose outputs change based on the operation to be performed on the memory array 2700.

Referring to FIGS. 26C, 27A, 27B, and 27C during a reset operation both $D_{sel}$ and $D_{sel\_}$ are 0. During set, read, or form operations, only one of $D_{sel}$ and $D_{sel\_}$ is 0. $D_{sl\_sel}$ is 0 when any of the two rows are selected. Row decoder circuit 2765 may enable the functionality of row driver circuit 2755 where values for $D_{sel}$, $D_{sel\_}$ and $D_{sl\_sel}$ change based on the operation to be performed on the memory array 2700, e.g., reset or some other operation. An embodiment of row decoder circuit 2765 may include voltage level shift circuits similar in function to voltage level shift circuit 2480 shown in FIG. 24C.

Referring back to FIG. 24B, the portion of row driver 2455 that drives the source lines of memory array 2400 may need voltage passed through the select transistor T1 during read, set, and form operations. Since select transistor T1, however, is a PMOS device that does not allow 0V to pass through it in the presence of a positive voltage signal at the gate, biasing the driver would necessitate passing a voltage higher than a threshold voltage for transistor T1, e.g., 0.5V, to the source line. This, in turn, would necessitate the bit line voltage to be raised by, e.g., 0.5V, which could raise power and other concerns. A solution to this problem may involve using row decoder 2766 shown in FIG. 27B in which $D_{sl\_sel}$=HIGH is output during read, set, and form operations and in which $D_{sl\_sel}$=LOW is output during reset operations for the selected row. Doing so allows passing 0V to the source line during read, set, and form operations using the NMOS transistor T2 shown in FIG. 24B.

Figure 28:
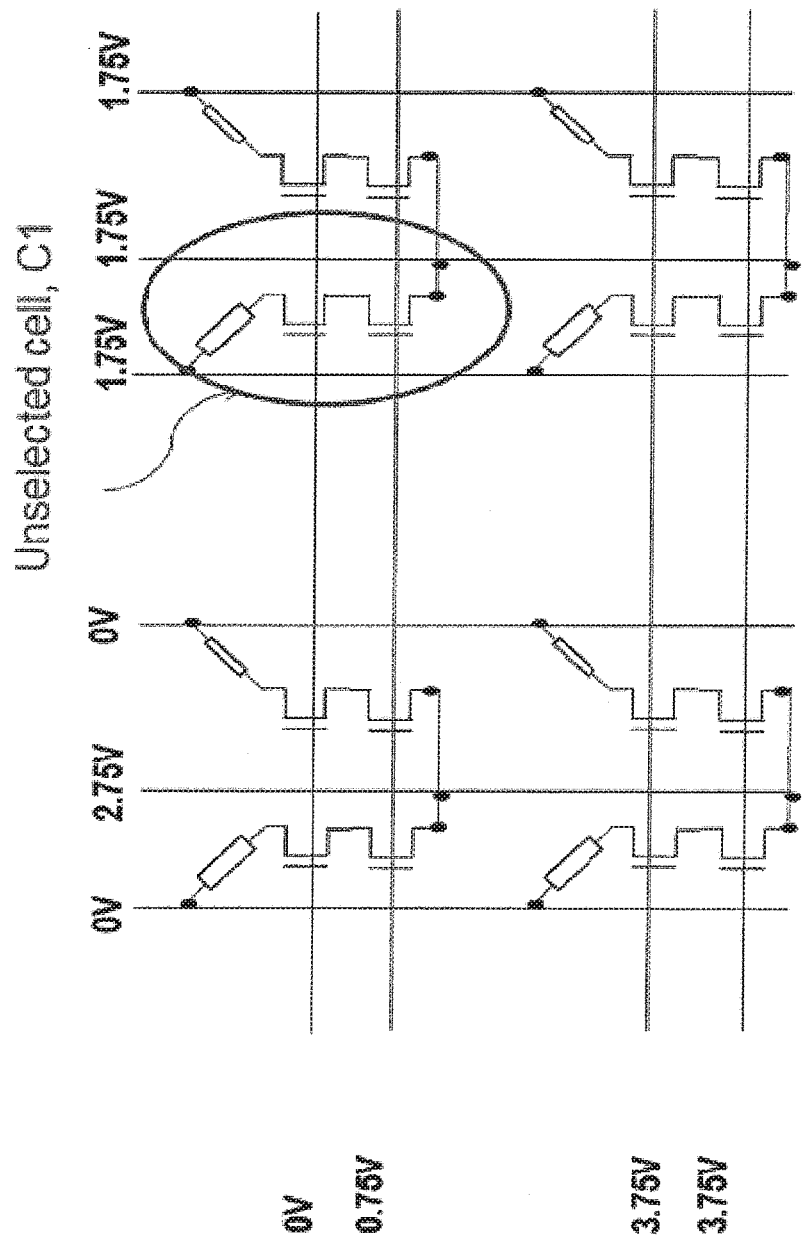
FIG. 28 is a diagram of an embodiment of a 2T-1R memory array having shared vertical source lines.

It should be apparent to a person of ordinary skill in the art that the concepts described above involving 2T-1R memory arrays and corresponding row decoder/driver circuits are equally applicable to vertical shared source line architectures for 2T-1R memory arrays in which the source lines are aligned vertically as shown in FIG. 28.

Figures 29A, 29B:
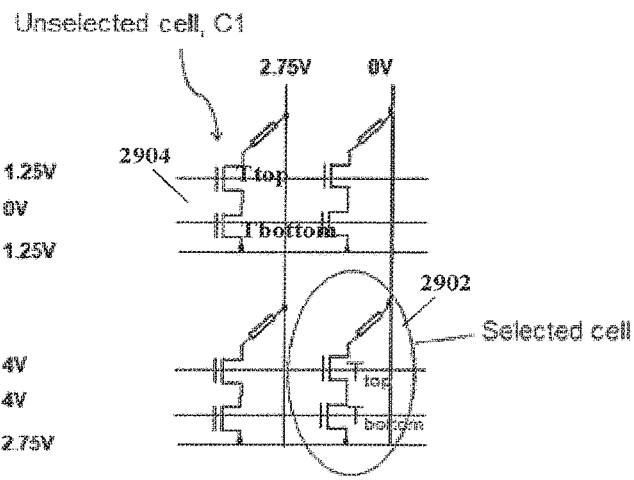
FIG. 29A is a diagram of an embodiment of a 2T-1R memory array.
FIG. 29B is a table listing various measured currents for an unselected cell of a 2T-1R memory array shown in FIG. 29A.

Leakage currents, produced by operating core or thin oxide transistors at high voltages, should to be carefully considered and minimized. In the following description and drawings, the present disclosure details various techniques to reduce static power in 2T-1R memory arrays. FIG. 29A is a diagram of an embodiment of a 2T-1R memory array with a biasing scheme during a reset operation. FIG. 29B is a table listing measured junction leakage current, sub-threshold leakage current, and maximum write current during the reset operation performed on a selected memory cell 2902.

Referring to FIGS. 29A and 29B, in an embodiment, select transistors $T_{top}$ and $T_{bottom}$ may be core FET transistors operated at high voltages that generate leakage currents at various junctions, e.g., the drain junction of transistor $T_{top}$ for unselected memory cell 2904. In a large memory array having a large number of memory cells that are similarly biased, the junction leakage current may be multiplied many times over creating reliability issues during operation. As shown in FIG. 29B, junction leakage currents (0.9 mA) during a reset operation, for example, may be of concern while sub-threshold leakage current (30 uA) is small for devices having regular voltage thresholds Vt. Non-uniform channel doping or halo doping may reduce junction leakage currents and, therefore, improve reliability.

Select transistors $T_{top}$ or $T_{bottom}$ may be halo doped meaning that either may be more heavily doped near the source and drain terminals to reduce the size of the depletion region in the vicinity of these junctions. At short channel lengths the halo doping of the source overlaps that of the drain, increasing the average channel doping concentration, and thus increasing the threshold voltage.

Figure 30:
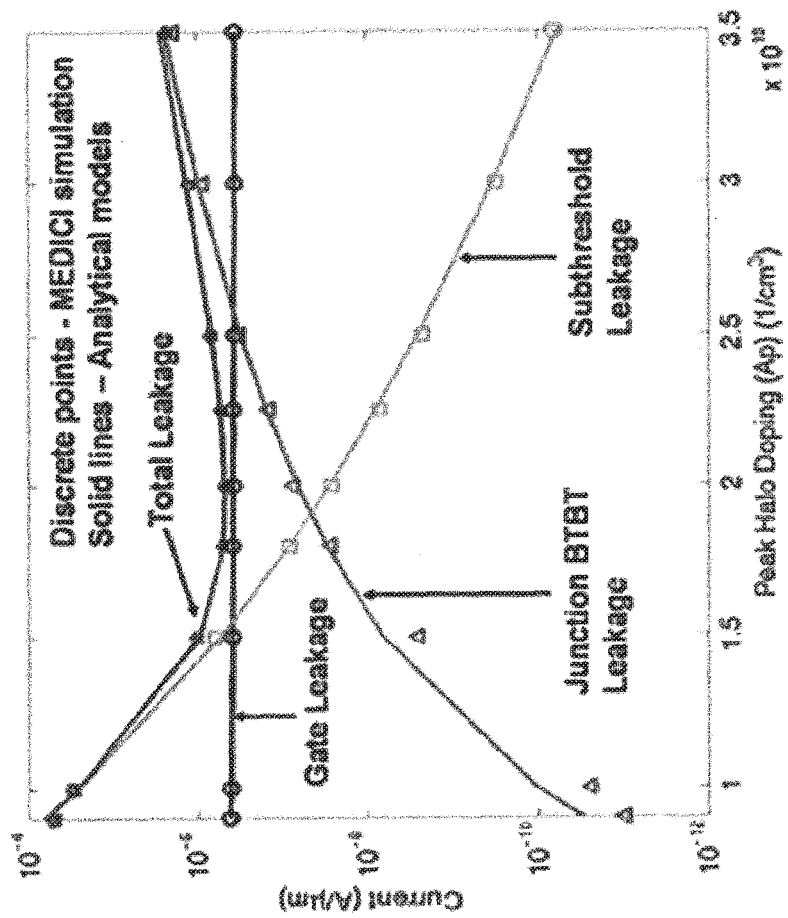
FIG. 30 is a diagram illustrating the effect of halo doping on the leakage current.

FIG. 30 is a diagram illustrating that halo doping levels are an important factor in determining junction leakage currents for unselected cell 2904 shown in FIG. 29A. By tailoring the halo implant of the drain junction of select transistor $T_{top}$, junction leakage may be reduced by two orders of magnitude, while increasing sub-threshold leakage. As shown in FIG. 29B, sub-threshold leakage current during a reset operation is less of a concern since it is relative small, and the drain junction of select transistor $T_{top}$ is only one of many contributors to sub-threshold leakage of unselected cells including unselected cell 2904. The tradeoff, therefore, may be acceptable. In an embodiment, halo doping may occur on just the drain side of select transistor $T_{top}$ or may vary at other junctions of the memory cell as well. Other embodiments could change halo doping by using additional masks or process optimizations similar to those described by T. B. Hook, et al., IEEE Transactions on Electron Device, September 2002, which is incorporated herein in its entirety.

Select transistor $T_{top}$ may determine junction leakage of unselected memory cell memory cell 2904 (and all other unselected memory cells). Select transistor $T_{bottom}$ may have a stronger body effect. Memory array 2900 may be optimized by building select transistor $T_{top}$ as a low junction leakage transistor and building select transistor $T_{bottom}$ as a high drive current transistor. FIG. 31 tabulates the junction leakage current, sub-threshold leakage current, total static leakage current and maximum write current for three different doping combinations for select transistors $T_{top}$ and $T_{bottom}$. FIG. 31 demonstrates that the total static leakage using a mix of select transistor types for $T_{top}$ and $T_{bottom}$ is similar, but drive current could be higher than architectures where the two select transistors $T_{top}$ and $T_{bottom}$ are similarly or identically doped. A person of ordinary skill in the art should realize that various other types of asymmetric transistors could be used in a 2T-1R memory array architecture.

FIG. 32 is a diagram of an embodiment of a 2T-1R memory array having shared vertical source lines. Referring to FIG. 32, a biasing scheme used with 2T-1R memory array 3000 having vertical source lines may be tuned to minimize leakage currents. Note that the bit line and source line of unselected memory cell C1 are at a same voltage thus eliminating sub-threshold leakage from these cells. The result is more flexibility for tuning the halo implants to reduce leakage.

Figure 33A:
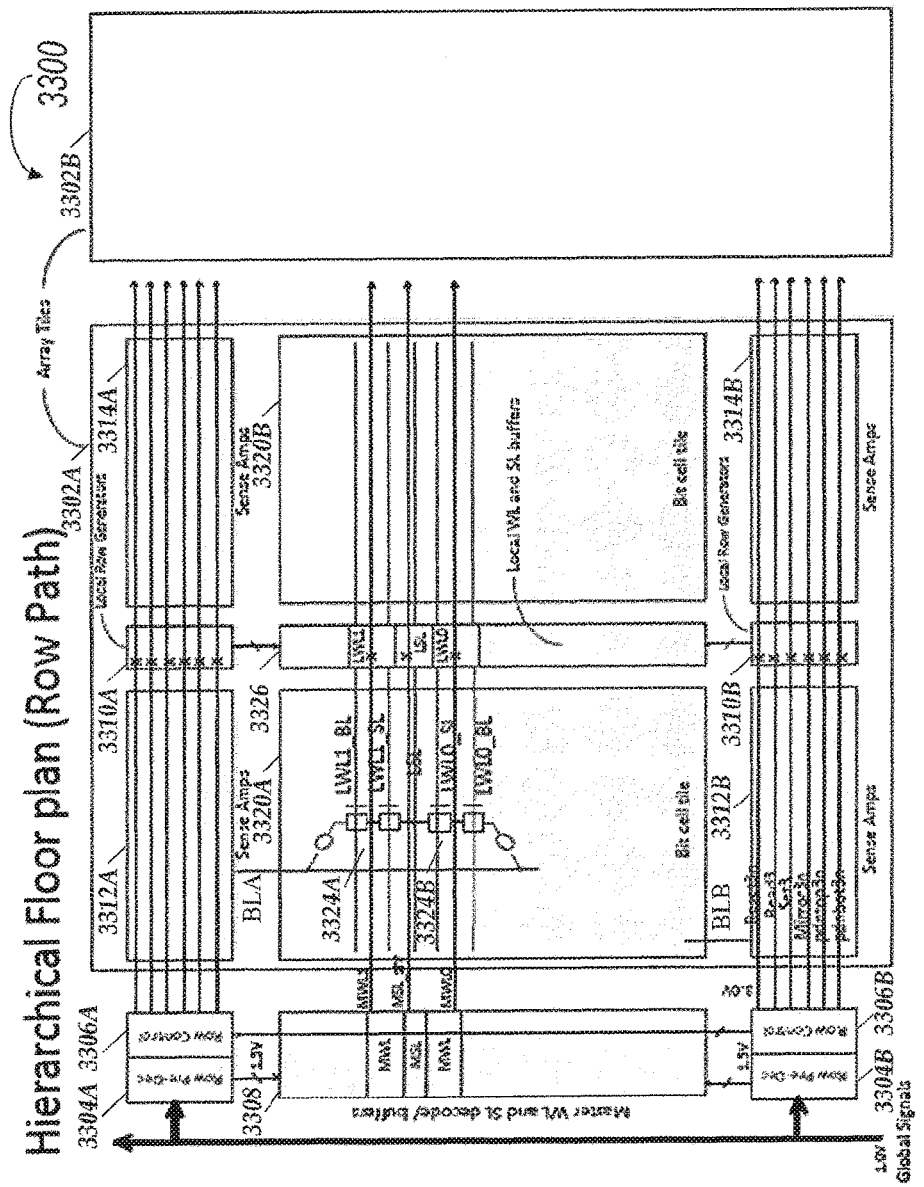
FIG. 33A is a diagram of an embodiment of a hierarchical floor plan for a 2T-1R memory array.

FIG. 33A is a diagram of an embodiment of a hierarchical floor plan for a 2T-1R memory device 3300. Referring to FIG. 33A, 2T-1R memory device 3300 comprises a plurality of array tiles, e.g., memory array tiles 3302A and 3302B. For simplicity, only memory array tile 3302A is described in further detail. It should be apparent to a person of ordinary skill in the art that other memory array tiles, e.g., memory array tile 3302B, are similarly constructed.

Memory array tile 3302A includes two bit cell tiles 3320A and 3320B and each bit cell tile, in turn, includes two 2T-1R memory cells 3324A and 3324B. Bit cell tiles 3320A and 3320B are divided by the local word line and source line buffers 3326.

Each of 2T-1R memory cells 3324A and 3324B (after FIG. 10) may also have a construction like that of 2T-1R memory cell 400 shown in FIG. 4A. As the 2T-1R name implies, each of 2T-1R memory cells 3324A and 3324B includes two select transistors and a memory element. Each of 2T-1R memory cells 3324A and 3324B is coupled to receive a bit line signal, two word line signals, and a source line signal. For example, memory cell 3324A is coupled to receive bit line signal BL, local word line signals LWL1_BL and LWL1_SL, and local shared source line signal LSL. For another example, memory cell 3324B is coupled to receive bit line signal BL, local word line signals LWL0_BL and LWL0_BL, and local source line signal LSL.

Note that the memory cells 3324A and 3324E are shown as having a shared source line LSL although other memory cell architectures, as described above, in which a source line is not shared between adjacent memory cells, come within the scope of the present disclosure.

Memory array tile 3302A further includes sense amplifiers 3312A and 3312B coupled to bit cell tile 3320A through corresponding bit line signals BLA and BLB and sense amplifiers 3314A and 3314B coupled to bit cell tile 3320B. Local row generator 3310A is coupled between sense amplifiers 3312A and 3314A and local row generator 3310E is coupled between sense amplifiers 3312B and 3314B. Local word line and source line buffers 3326 are coupled between bit cell tiles 3320A and 3320B. Local row generators 3310A and 3310E are configured to generate local word lines LWLs and local source line LSL signals.

Sense amplifiers 3312A and 3314A are coupled to receive row control signals from row control circuit 3306A, which is coupled in turn to row pre-decoder 3304A. Similarly, sense amplifiers 3312B and 3314B are coupled to receive row control signals from row control circuit 3306B, which is coupled in turn to row pre-decoder 3304B. Row pre-decoders 3304A and 3304B are coupled to master word line and source line decoder 3308, which is configured to provide master word lines MWLs and master source lines MSL_shr to local word line and source line buffer 3326.

A voltage realm in the present disclosure refers to a range of voltage values in which particular circuits, components, and the like may be capable of reliably indicating high and low signals. Logic devices operate in any number of voltage realms, e.g., 5V, 3.3V, 3V, 2.5V, 1.8V, 1.5V, and the like. To communicate reliably between logic voltage levels, level shifting between signals may be desirable.

Memory array tile 3302A may be controlled using a global signals bus powered at a first voltage in a first voltage realm, e.g., 1V, to allow saving power and circuit area. Pre-decoders 3304A and 3304B may pre-decode the address signals from the global address bus and provide them to row control circuits 3306A and 3306 and master word line and source line buffer 3308. Pre-decoders 3304A and 3304B may voltage level shift the global signals from the first voltage (first voltage realm) to a second voltage (second voltage realm), e.g., from 1V to 1.5V, using any manner of voltage level shift circuitry known to a person of ordinary skill in the art. Pre-decoders 3304A and 3304B may provide the local row pre-decoded address bus signals to row control circuits 3306A and 3306B and master word line and source line buffer 3308. Master word line and source line buffer 3308 may decode and level shift the master word line MWL and the master source line MSL_shr to the second voltage (second voltage realm) to a third voltage (third voltage realm), e.g., from 1.5V to 3V, to interface to the local word line and source line buffer 3326. Master source line MSL_shr may be pulled low only during a reset operation.

Local row control generators 3310A and 3310E may voltage level shift row control signals from the second voltage (second voltage realm) to a third voltage (third voltage realm), e.g., from 1.5V to 3V, to interface to local word line and source line buffer 3326.

Array tile 3302A is illustrated with the local word line and local source line buffer 3326 located in the center in FIG. 33A although other arrangements are possible. Another embodiment may involve locating the local word line and source line buffer 3326 to the left or right of the bit cell tiles 3320A or 3320B may be optimal for some memory device technologies or architectures. For example, it may be beneficial to drive the local word line signal LWL0 (even) from the left side while driving the local word line signal LWL1 (odd) from the right side, with driving the local source line from one or both sides.

Figure 33B:
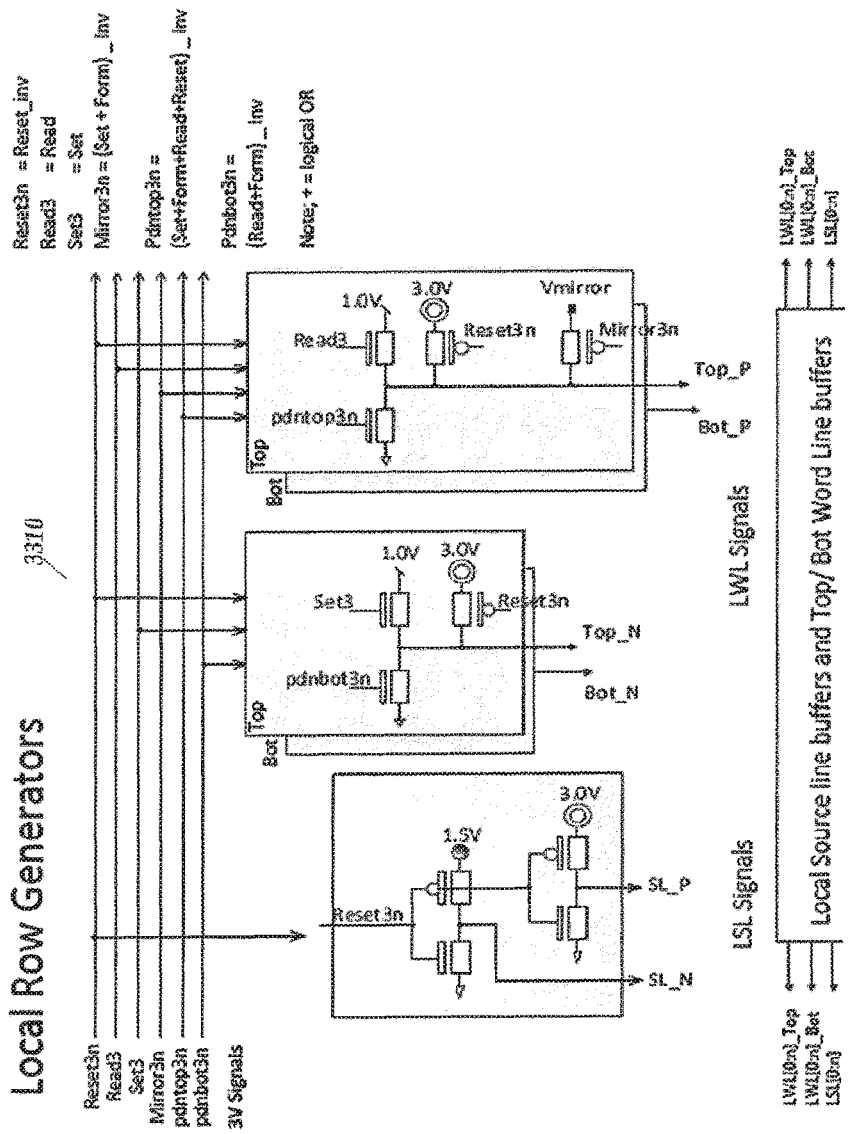
FIG. 33B is a diagram of an embodiment of local row generators.

FIG. 33B is a diagram of an embodiment of local row generator 3310. Referring to FIG. 33B, local row generator 3310 is configured to generate local word line signals LWL and local source line signal LSL for interfacing with local word line and source line buffer 3326 in response to decoded signals received from a corresponding row control circuits, e.g., 3306A or 3306B. The decoded signal received from row control circuits 3306A or 3306B may indicate any of the various operations to be performed on array tiles 3302A and 3302B, e.g., set, read, reset, or form. In an embodiment, local row generator 3310 may include thick oxide devices capable of sustaining 3V biased signals over the product's lifetime.

Figure 33C:
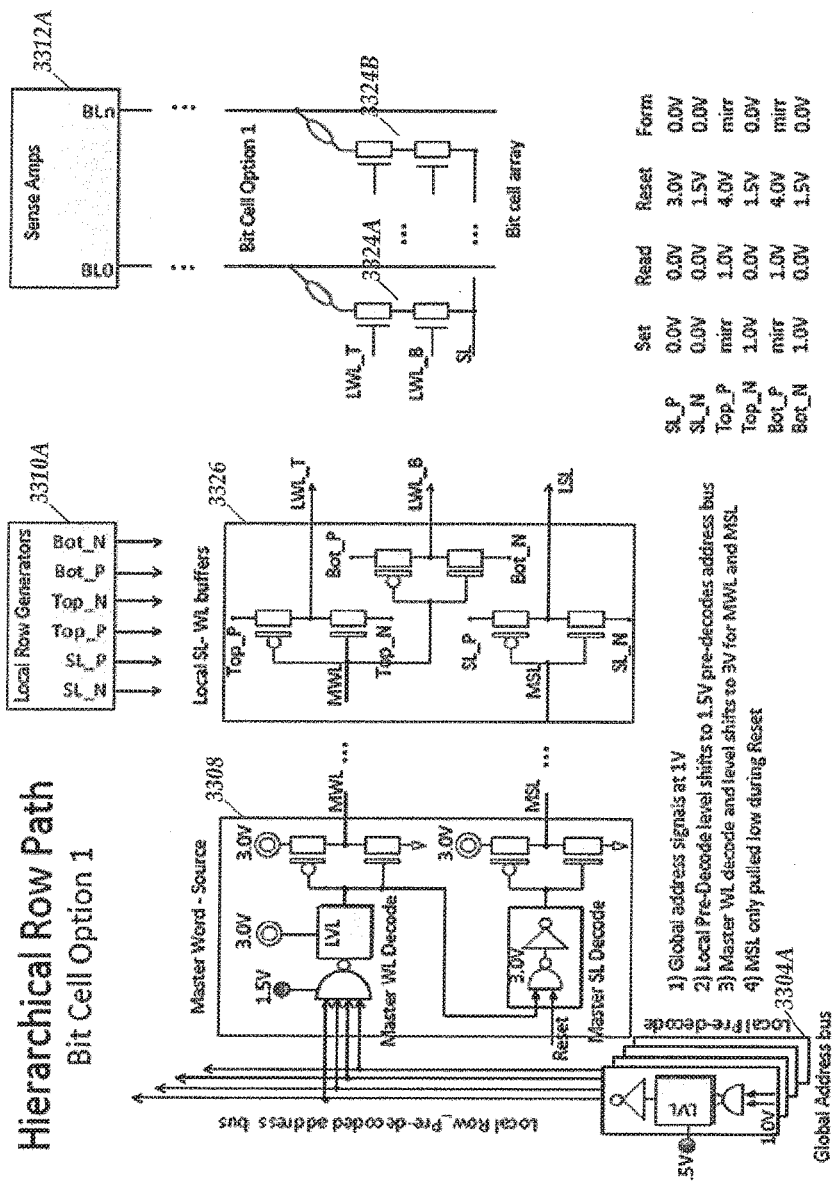
FIG. 33C is a diagram of an embodiment of a hierarchical row path.

FIG. 33C is a diagram of an embodiment of a hierarchical row path to illustrate a voltage level shift operation of row pre-decoder 3304A and master word line and source line decoder 3308 as they operate on bit cells 3324A and 3324B. Referring to FIG. 33C, row local pre-decoder 3304A is configured to pre-decode row addresses at a first voltage in the first voltage realm, e.g., 1V, and provides the local pre-decoded addresses to master word line and source line decoder 3308, which, in turn, is configured to level shift the pre-decoded master word line MWL and master source line MSL from the first voltage in the first voltage realm, e.g., 1V, to the second voltage in the second voltage realm, e.g., 3V, using any voltage level shift circuit known to a person of ordinary skill in the art. Doing so, allows a reduction in the depth of the master word line and source line decoder 3308. Because voltage level shift circuits can be area intensive, in one embodiment the level shift decode state may be combined with the reset to control the master word line and source line decoder 3308. In an embodiment, during activation, unselected master word line signals and master source line signals remain at 3V while selected master word line signal MWL is pulled to Vss. Only during a reset operation, the selected master source line MSL is also pulled to Vss. Local row generator 3310 is configured to control local word line and source line buffer 3326 that, in turn, generates the local word line signals LWL and local source line signals LSL.

Figure 33D:
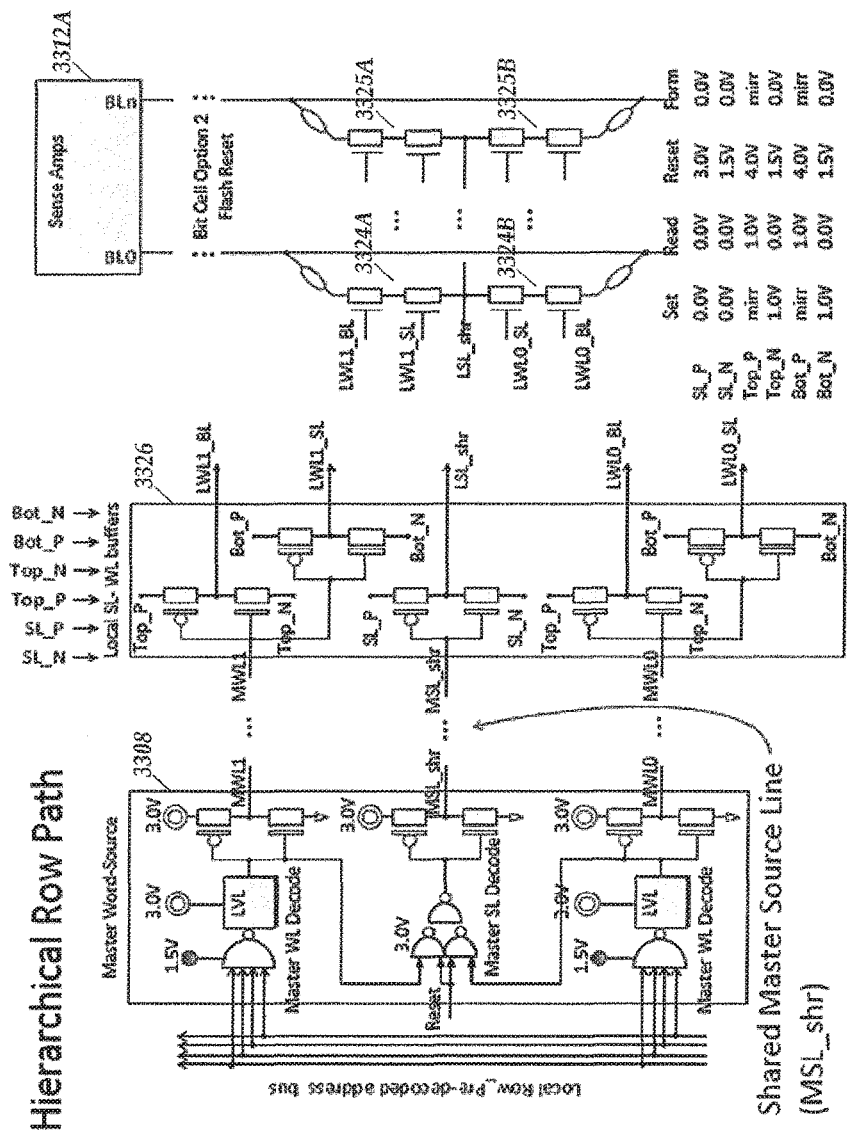
FIG. 33D is a diagram of another embodiment of a hierarchical row path.

FIG. 33D is a diagram of an embodiment of a hierarchical row path to illustrate a voltage level shift operation of row pre-decoder 3304A and 3304B and master word line and source line decoder 3308 as they operate on bit cells 3324A and 3324B, which share a source line. Referring to FIG. 33D, bit cells 3324A and 3324B share a source line signal LSL_shr, which enables a flash reset described in detail above.

In an embodiment, during activation, unselected master word line signals MWL0, MWL1 and master source line signals MSL_shr remain at 3V. Shared master source line signal MSL_shr is generated by decoding the level shifted inputs to the MWL0 and MWL1 buffers. As in Option 1, the selected master word line signal MWL0 or MWL1 is to be pulled to Vss. Only during a reset operation, the selected master source line signal MSL_shr is also pulled to Vss. The LWL and LSL are then controlled from the Local Row generator signals, as in Option 1 in FIG. 33C. An advantage to the circuit shown in FIG. 33D is that five signals control two bit cells while the circuit shown in FIG. 33C utilizes six signals to control the two bit cells.

It will also be appreciated by persons of ordinary skill in the art that the present disclosure is not limited to what has been particularly shown and described hereinabove. Rather, the scope of the present disclosure includes both combinations and sub-combinations of the various features described hereinabove as well as modifications and variations which would occur to such skilled persons upon reading the foregoing description. Thus the disclosure is limited only by the appended claims.

The invention claimed is:

1. A method of operating an array of memory cells, each memory cell including a resistive memory element electrically coupled in series to a corresponding first transistor and to a corresponding second transistor, the first transistor including a first gate coupled to a corresponding one of a plurality of first word lines and the second transistor including a second gate coupled to a corresponding one of a plurality of second word lines, each memory cell coupled between a corresponding one of a plurality of bit lines and a corresponding one of a plurality of source lines, the method comprising:

Identifying as a selected first word line, a selected second word line, a selected bit line, and a selected source line, respectively, one of the plurality of first word lines, one of the plurality of second word lines, one of the plurality of bit lines and one of the plurality of source lines corresponding to a first one of the memory cells that is selected for an operation;

applying a first word line voltage to each of the selected first and second word line based on the operation;

applying a first bit line voltage to the selected bit line;

boosting the first bit line voltage applied to the selected bit line to a second bit line voltage; and forming the resistive memory element corresponding to the first one of the memory cells that is selected for the operation in response to applying the first word line voltage to the selected first word line; and sharing a charge on the selected bit line with a bit line corresponding to a memory cell to be selected next for a forming operation.

2. The method of claim 1, further comprising:

identifying as unselected first word lines, unselected second word lines, unselected bit lines, and unselected source lines, respectively, the corresponding first word lines, second word lines, bit lines, and source lines for memory cells that are unselected for the operation other than the first one of the memory cells that is selected for the operation; and applying a second word line voltage different from the first word line voltage to the unselected second word lines before applying the first word line voltage to the selected second word line.

3. The method of claim 1, further comprising:

using a charge pump circuit to boost the first bit line voltage applied to the selected bit line to the second bit line voltage.

4. The method of claim 1, further comprising:

discharging the selected bit line to ground after the forming the resistive memory element.

5. The method of claim 1, further comprising:

discharging the selected first word line to ground after the forming the resistive memory element.

6. A memory cell, comprising:

a resistive memory element;

a first switching element coupled in series with the resistive element; and a second switching element coupled in series with the first switching element, wherein the first switching element and the second switching element are configured to perform a select function for the resistive memory element, and wherein the first switching element includes a first drain or source junction having a first doping level, and the second switching element includes a second drain or source junction having a second doping level different from the first doping level.

7. The memory cell of claim 6, wherein the first doping level of the first switching element is optimized to reduce leakage current at the first drain or source junction.

* * * * *